United States Patent
Fishbaine et al.

(10) Patent No.: US 6,292,261 B1
(45) Date of Patent: *Sep. 18, 2001

(54) ROTARY SENSOR SYSTEM WITH AT LEAST TWO DETECTORS

(75) Inventors: David Fishbaine, Minnetonka; Steven K. Case, St. Louis Park; John P. Konicek; Thomas L. Volkman, both of Minneapolis; Brian D. Cohn, Northfield; Jeffrey A. Jalkio, St. Paul, all of MN (US)

(73) Assignee: CyberOptics Corporation, Minneapolis, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/314,545

(22) Filed: May 19, 1999

Related U.S. Application Data

(60) Provisional application No. 60/086,509, filed on May 22, 1998.

(51) Int. Cl.[7] ..................................................... G01B 11/14
(52) U.S. Cl. .................... 356/375; 250/559.29; 348/126; 382/146
(58) Field of Search ..................................... 356/375, 237, 356/400, 446, 394; 250/560, 561, 559.29, 559.34; 382/8, 47, 151, 146, 149; 348/126

(56) References Cited

U.S. PATENT DOCUMENTS

| | | |
|---|---|---|
| 3,854,052 | 12/1974 | Asar et al. . |
| 4,553,843 * | 11/1985 | Langley et al. ...................... 356/375 |
| 4,615,093 | 10/1986 | Tews et al. . |
| 4,647,208 | 3/1987 | Bieman . |
| 4,696,047 * | 9/1987 | Christian et al. ........................ 382/8 |
| 4,733,969 | 3/1988 | Case et al. . |
| 4,745,295 * | 5/1988 | Seno et al. ........................... 250/560 |
| 4,872,747 | 10/1989 | Jalkio et al. . |
| 5,005,978 | 4/1991 | Skunes et al. . |
| 5,015,096 | 5/1991 | Kowalski et al. . |

(List continued on next page.)

FOREIGN PATENT DOCUMENTS

| | | |
|---|---|---|
| 0 577 128 A1 | 5/1994 | (EP) . |
| 6-249629 | 9/1994 | (JP) . |
| 6-307831 | 11/1994 | (JP) . |
| 7-336099 | 12/1995 | (JP) . |
| WO 97/30572 | 8/1997 | (WO) . |
| 98/06059 | 2/1998 | (WO) . |
| 98/09276 | 3/1998 | (WO) . |
| 98/18135 | 4/1998 | (WO) . |
| 98/20311 | 5/1998 | (WO) . |

*Primary Examiner*—Frank G. Font
*Assistant Examiner*—Sang H. Nguyen
(74) *Attorney, Agent, or Firm*—Dicke, Billig & Czaja, P.A.

(57) ABSTRACT

The present invention includes a system for providing a signal related to a physical condition of an object, such as an electronic component. Various types of electronic components may be used with the present invention, including leaded components, column, pin or grid array packages, and the like. The system includes a quill for releasably holding the object. The object has a major surface defining a plane, and a motion control system for rotating the quill about a central axis. Control electronics in the invention provide a plurality of trigger signals to each of two detectors, each detector adapted to view the same stripe in the plane upon receipt of a trigger signal and to output an image of the stripe. The detectors view a plurality of stripes while the motion control system rotates the quill, and the output from the detectors is received by processing circuitry for processing the plurality of images of the stripes to provide the signal related to the physical condition of the object. The signal may be computed to provide the orientation of the object, the location of a feature on the object, the distance between leads on a leaded component or the coplanarity of raised features on the object. A method of picking and placing components is also disclosed for use with the apparatus of the present invention.

77 Claims, 25 Drawing Sheets

U.S. PATENT DOCUMENTS

| | | |
|---|---|---|
| 5,039,210 | 8/1991 | Welstead et al. . |
| 5,046,851 | 9/1991 | Morgan . |
| 5,086,559 | 2/1992 | Akatsuchi . |
| 5,114,229 * | 5/1992 | Hideshima ................... 356/273 |
| 5,208,463 * | 5/1993 | Honma et al. ................ 250/561 |
| 5,249,239 * | 9/1993 | Kida ................................ 382/8 |
| 5,260,791 | 11/1993 | Lubin . |
| 5,278,634 | 1/1994 | Skunes et al. . |
| 5,293,048 | 3/1994 | Skunes et al. . |
| 5,309,223 | 5/1994 | Konicek et al. . |
| 5,331,406 | 7/1994 | Fishbaine et al. . |
| 5,348,956 | 9/1994 | Van Keulen et al. . |
| 5,377,405 | 1/1995 | Sakurai et al. . |
| 5,384,956 | 1/1995 | Sakurai et al. . |
| 5,440,391 | 8/1995 | Smeyers et al. . |
| 5,450,206 | 9/1995 | Caillat et al. . |
| 5,465,152 | 11/1995 | Bilodeau et al. . |
| 5,467,186 | 11/1995 | Indo et al. . |
| 5,491,888 | 2/1996 | Sakurai et al. . |
| 5,559,727 * | 9/1996 | Deley et al. ................... 356/375 |
| 5,566,447 | 10/1996 | Sakurai . |
| 5,570,993 | 11/1996 | Onodera et al. . |
| 5,608,642 | 3/1997 | Onodera . |
| 5,619,328 | 4/1997 | Sakurai . |
| 5,621,530 | 4/1997 | Marrable, Jr. . |
| 5,646,733 | 7/1997 | Bieman . |
| 5,660,519 | 8/1997 | Ohta et al. . |
| 5,694,384 | 12/1997 | Luster . |
| 5,701,179 | 12/1997 | Chatterjee . |
| 5,715,051 | 2/1998 | Luster . |
| 5,734,475 | 3/1998 | Pai . |
| 5,742,504 | 4/1998 | Meyer et al. . |
| 5,743,005 | 4/1998 | Nakao et al. . |
| 5,751,450 | 5/1998 | Robinson . |
| 5,753,903 | 5/1998 | Mahaney . |
| 5,757,176 | 5/1998 | Farrow . |
| 5,757,978 | 5/1998 | Flick et al. . |
| 5,764,386 | 6/1998 | Robinson . |
| 5,768,759 | 6/1998 | Hudson . |
| 5,825,913 | 10/1998 | Rostami et al. . |
| 5,878,484 | 3/1999 | Araya et al. . |
| 5,897,611 * | 4/1999 | Case et al. .................... 356/375 |

\* cited by examiner

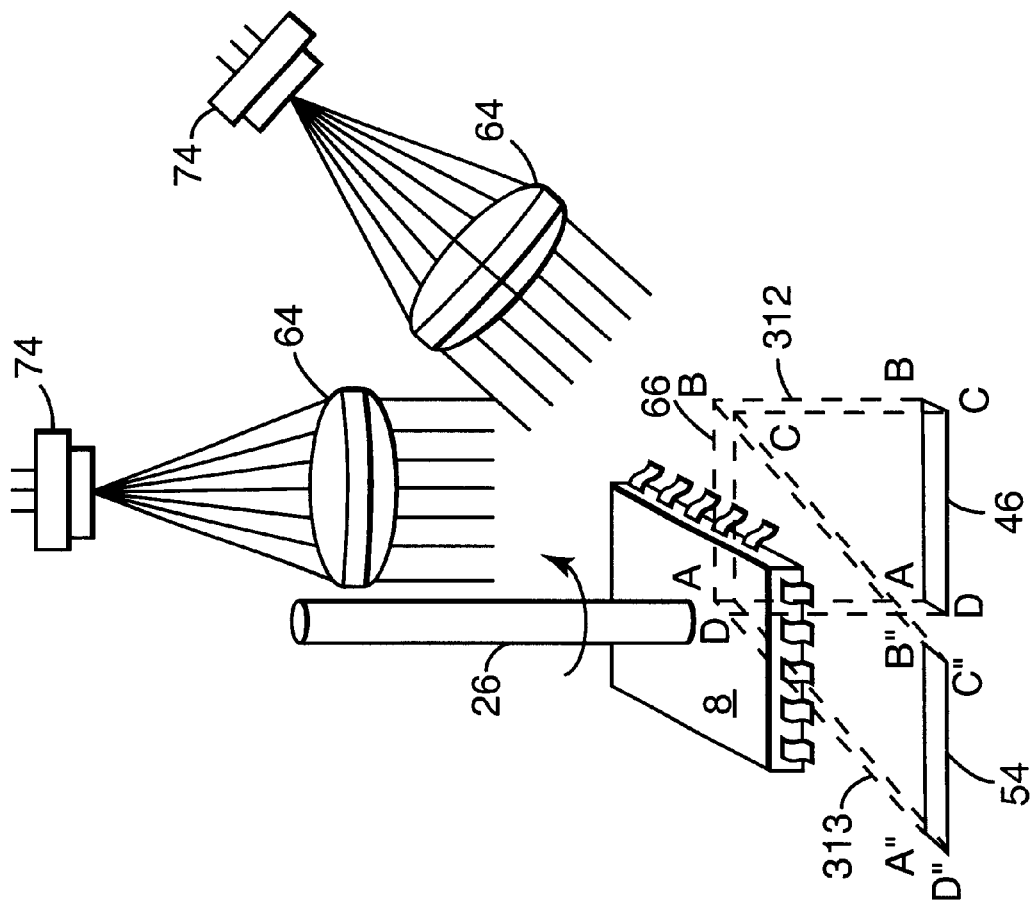
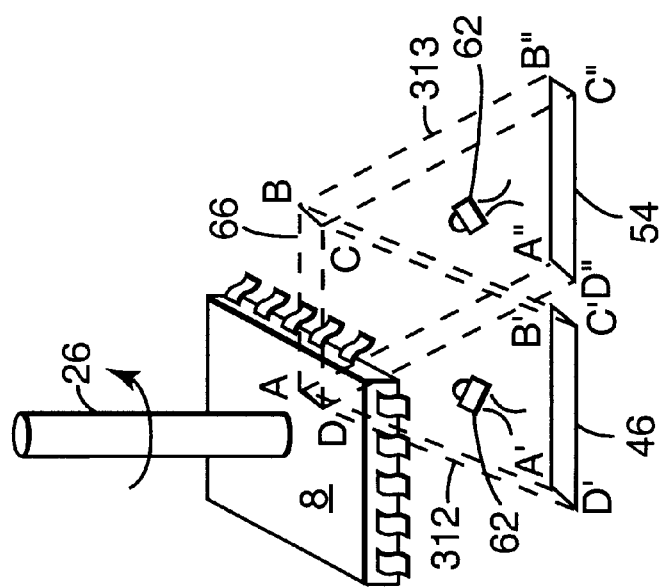
Fig. 7D
Fig. 7C

ROTARY SENSOR SYSTEM WITH AT LEAST TWO DETECTORS

PRIORITY CLAIM

The present application claims priority from the provision application titled Optical Sensing Devices and Methods, application Ser. no. 60/086,509 filed May 22, 1998.

CROSS REFERENCE TO RELATED APPLICATION

This application is related to the subject matter of the application titled Rotary Sensor System with a Single Detector, filed on the same day with the present application.

COPYRIGHT RESERVATION

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

This invention relates to optical sensor systems for determining the location or orientation of an object, such as an electronic component, including such systems which report a physical condition of the object, such as the orientation of the object, the height of a particular feature on the object, the distance between features on the object, the presence of expected features on the object or the coplanarity of features on the object.

BACKGROUND OF THE INVENTION

Component Position Computation

There are many optical-based approaches to identifying various parameters related to an object, such as an electronic component. The various parameters which may be reported include orientation of the component, location of features on the component, indications of the quality of the component, such as a bent lead (lead tweeze) in the case of a Quad Flat Pack (QFP) component, or a measurement of a feature located on the bottom of the component, such as the height of a ball on a Ball Grid Array (BGA) component. The system for identifying these parameters is generally mounted in a pick and place machine which picks up the component and places the component on a printed circuit board. All of these approaches rely on a quill in the pick and place machine to pick up the component, and all generally utilize the motion control system in the pick and place machine in the measurement process. Some of the approaches use cameras to collect data representative of an image of the component and others collect data representative of an outline of the component, and all have some sort of processor that analyzes the collected data in order to identify some specific portion of the component, such as the edges of the part or the tips of the component leads. The sections below briefly describe a variety of the approaches used today, and describe their relative advantages and disadvantages.

In general, the systems described below can be characterized as being either "on-head" or "off-head." On-head sensor systems (considered together with their host pick and place machines) sense for the orientation of the component while the component travels to the target circuit board. On-head systems are preferred, as they minimize the amount of time required to place a component on a board, thereby increasing the throughput of the pick and place machine.

Off-head sensor systems perform the data collection in a fixed location on the pick and place machine. With an off-head system, the quill must first move the component to the dedicated station and after acquiring the image, move the component to the target circuit board for placement. Off-head systems typically reduce the machine's throughput since the head makes additional stops or travels further, but are used because they are inexpensive, reduce the mass which must be carried on the head and one sensor can readily service multiple quills.

Another way to characterize various sensor systems is by the relative location of the detector and the light source with respect to the component. FIGS. 1A–C show the three schemes of front-lit, back lit and shadow cast sensor systems, respectively. In front-lit systems, light from a source illuminates the features of interest on the component and the light reflected off of the features is optionally directed through optics forming an image on a detector. In back-lit systems, light from a source is incident on the component, and then optionally directed through focusing optics before it reaches a detector. Because the detector does not collect light scattered off the bottom of the component in either the back-lit or the shadow-cast systems, neither type of system is capable of inspecting features on the bottom of components, such as balls on a Ball Grid Array (BGA) or pins on a pin grid array (PGA). In shadow cast systems, light from a source optionally travels through collimating optics, onto the component, optionally directed through an optical system and then casts a shadow on the detector.

One approach in use today for assessing the orientation of an electronic component on a pick and place quill data representative of a shadow of the component, sometimes exclusively using the data representative of the edges of the shadow to perform its orientation computation. One such sensor is available from CyberOptics® Corporation and is called a LaserAlign® Sensor. In this shadow cast sensor system, light is cast onto the component from one side of the component and a linear detector on the other side of the component captures data representative of the component's shadow. Appropriate electronics analyze the data to compute the x,y,θ coordinates of a pre-selected feature on the component. FIG. 2 shows this approach schematically and the method is described further in U.S. Pat. No. 5,278,634 to Skunes et al., assigned to CyberOptics Corporation. This approach takes advantage of the motion control system already installed on the pick and place machine, which has an accurate encoder for reporting the angular position of the quill. At several angular positions, the system collects data from the detector representative of the shadow of the component. As appropriate for the type of component, the angular positions do not have to be equally spaced over 360 degrees nor is the component required to spin at a constant angular velocity. For each angular position, the sensor system computes the width of the component's shadow. By assessing the shadow center position at the minimum shadow width angle the component location in one axis can be determined. By measuring two shadow positions at the two minimum widths 90° apart, the position of a rectangular component can be computed. This system does not provide any further information not already derived from the shadow edges. Hence, it cannot identify misplaced or missing balls on BGAs or flip-chips. One main advantage of the sensor, however, is that it can be placed on-head, which allows for increased throughput of the pick and place machine.

Another on-head system employs a video camera on the moving head. In this approach, the camera stares down parallel to the pickup quill, and a right angle prism (or equivalent) is moved under the camera and component during travel, shown in FIGS. 3A–B. In this approach, there is typically one camera for each pick-up nozzle. This system has three drawbacks. First, there is substantial cost and mass associated with the right angle prism and the mechanism to slide it reliably into place. Second the minimum time between pickup and placement is limited by the time required to raise the nozzle, slide the prism into position, acquire the image, slide the prism out of position, and then lower the nozzle. Finally, the prism must be roughly as thick as the width of the component to be measured. Hence, the z motion of the component during pickup and placement is much longer than is required for other approaches.

One off-head approach to assessing component orientation is to place one or more fixed position upward looking video cameras (e.g., 2D array detectors) in the pick and place machine at a dedicated station. For small components, or ones with relatively coarse pitch between leads, one image of the component is taken and its position determined from analyzing a single image. For larger components with fine pitch, several images may be needed to provide adequate resolution. This approach utilizes standard components (e.g., cameras, optics, image processing hardware and image processing software) which may be easily assembled by pick and place machine manufacturers. However, this off-head system is slower than on-head approaches for the reasons stated above. The path from pickup to placement of the component must be altered to travel over the camera, degrading overall throughput of the pick and place machine. It is also likely that the travel will need to be slowed or stopped over the camera to obtain a clear image. If multiple images must be collected, this slows the process even further.

Another off-head system uses line scan cameras instead of 2D array cameras. Line scan cameras typically provide better spatial resolution than array cameras. Compared to area array cameras, line scan cameras will typically have shorter exposure times, hence higher brightness light sources are required. In a line scan camera, the image is built-up one line of pixels at a time as the object and the camera move relative to one another.

Feature Inspection

In order to optically assess the quality of components before placement on a circuit board, several systems allow for inspection of lead coplanarity, missing or improperly placed balls or other quality issues with the component.

One off-head system approach uses standard CCD cameras to image at least a portion of the component, either as the component passes unidirectionally over a line scan camera, or with the component fixedly held over the camera. From an image of the portion of interest on the component, computations about the lead tweeze in a component with leads, missing balls on a ball grid array or the like may be made. This system cannot assess any parameter related to height such as lead or ball coplanarity.

One off-head sensor system for assessing lead coplanarity is shown schematically in FIG. 4 and described in U.S. Pat. Nos. 5,331,406 and 5,309,223 to Konicek and Fishbaine, which pre-aligns the component perpendicularly with respect to the direction of scan. The system employs two or more beams of light which intersect in a point, where the height of the component is held constant with respect to the point while the leads on one side of the component are sequentially passed through the beams. As the component moves at the constant reference height, each lead sequentially blocks and then unblocks at least two of the beams. Once the leads on the first edge of the component are analyzed, leads on the second, third and fourth edges of the component are analyzed.

Another version of this method uses two similar sensors positioned on opposite sides of a rectangular component. This method increases throughput by a factor of two, because all four edges of the component are analyzed in two movements of the quill. Because this is a shadow cast system, it is unable to inspect the features on the bottom of components, such as improperly manufactured balls on a BGA.

Another approach uses a high aspect ratio detector (possibly both in terms of pixel count and aspect ratio of individual detectors) that is placed at approximately the same height as the leads to be measured. Two or more point sources are placed opposite the detector and slightly below the leads. Images are collected of the shadows cast from each point source and analyzed to determine the heights of the leads. One version of this has four copies of this geometry, one for each side of the component. This approach is very fast, and has the added advantage of being on-head. With appropriate software it may also be possible to determine the component position and orientation with sufficient accuracy for placement. The disadvantages of the device are its need for a custom detector array and the large size for an on-head device (hence limiting the number of heads which can be installed on a machine).

Another approach is to scan a laser across the device and observe the laser's apparent position from an oblique angle (which may also be scanned). The primary advantages of this approach are speed and versatility. As this method is a front-lit system, features on the bottom of parts can be measured. A resonant or polygon scanner shifts the beam rapidly across the component in one axis while the component is translated in the other. The disadvantages of this approach are the relative complexity of the sensor, the challenge of dealing with a wide range of surface reflectivities, and maintaining a constant height for the component while scanning.

The prior art has its limitations, and a single system which takes advantage of the existing precision rotary motion capability of the pick and place machine, provides orientation and component quality information, and is capable of providing on-head coplanarity information without requiring pre-alignment steps is needed.

SUMMARY OF THE INVENTION

The present invention includes a system for providing a signal related to a physical condition of an object, such as an electronic component. Various types of electronic components may be used with the present invention, including leaded components, column, pin or grid array packages, and the like. The system includes a quill for releasably holding the object. The quill has a central axis, and the central axis of the quill is perpendicular to a viewing plane. A motion control system rotates the quill about the central axis. Control electronics in the invention provide, a plurality of trigger signals to each of two detectors, each detector adapted to view the same stripe in the viewing plane upon receipt of a trigger signal and to output an image of the stripe. The detectors view a plurality of stripes while the motion control system rotates the quill, and the output from the detectors is received by processing circuitry for processing the plurality of images of the stripes to provide the signal related to the physical condition of the object. The stripes may view across the object, or may view a stripe bridging from about the center of the object to its edges and optionally lens systems are interposed before the detectors to focus the images, such as a gradient index (GRIN) lens array. The invention includes various placements of the detectors, including one embodiment where the detectors are parallel to each other, and one where they are effectively in the same package. In another embodiment, three or more detectors with parallel or common packages are oriented to view the same stripe. In a preferred embodiment, one of the detectors is located directly beneath the stripe and the other detector or detectors view the same stripe from a direction other than a position under the component. In another embodiment, the detectors are oriented so that observation planes (between the detectors and the stripe) intersect the central axis of the component in a quill. Alternatively, the detectors are oriented so that the central axis of the quill is in the observation planes. The signal may be representative of orientation of the object, location of a feature on the object, an indication of quality about the object, such as lead tweeze, or coplanarity of raised features on the object.

Several types of illumination may be added to the present invention, including front-lit, (e.g., specular, diffuse and combinations thereof), back-lit and back-lit shadow casting. The light source may be various types of light sources, including a laser, LEDs or the like. Optionally, a prism or the like may be positioned above the object, to provide re-direction of light from the light source. Other options for building the present invention include mirrors in the receive and transmit paths in order to make the sensor of the present invention more compact.

In a preferred embodiment of the present invention, the present invention is incorporated in a pick and place machine and the method of the present invention is used to place components on-head. Otherwise, the present invention may be practiced off-head.

Several novel methods are disclosed to practice the apparatus of the present invention, the first being a method including the steps of releasably picking up the object with a quill, positioning the object relative to at least two detectors, the detectors adapted to view a stripe on a viewing plane perpendicular to an axis of rotation of the quill and including electronics adapted to provide a signal representative of a physical condition of the component, and rotating the component while acquiring a plurality of images of the stripes, the electronics providing the signal as a function of the images. Optional steps which the pick and place may also employ include the step of deciding whether to discard the object as a function of the signal, and the steps of moving the object to a placement area and placing the object as a function of the signal. As discussed, the method may be practiced on-head or off-head in a pick and place machine.

In the preferred method of use of the present invention, the axis of rotation of the object is held stationary with respect to the detectors while the component is rotated and data is acquired. In another method, the axis of rotation translates during data acquisition.

BRIEF DESCRIPTION OF THE DRAWINGS

FIGS. 7A–D show a first embodiment of the present invention with diffuse front-lit illumination, back-lit illumination, specular front lit illumination and back lit shadow casting illumination, respectively;

For convenience, items in the figures having the same reference symbol are the same or serve the same or a similar function.

DETAILED DESCRIPTION OF THE PREFERRED EMBODIMENTS

Figure 1C:
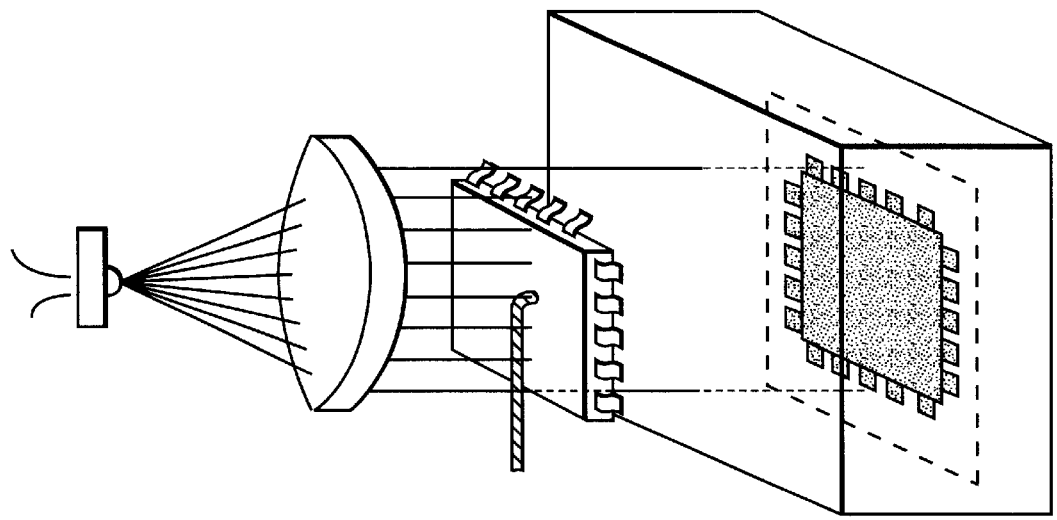
FIGS. 1A–C show a diagrams of a front-lit, back-lit and back-lit shadow cast illumination optical system, respectively.
Figure 1B:
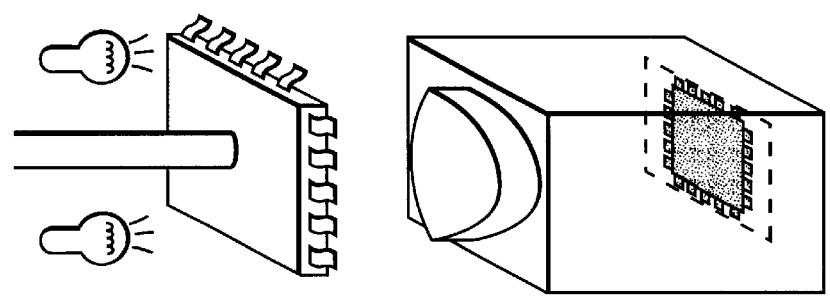
Figure 1A:
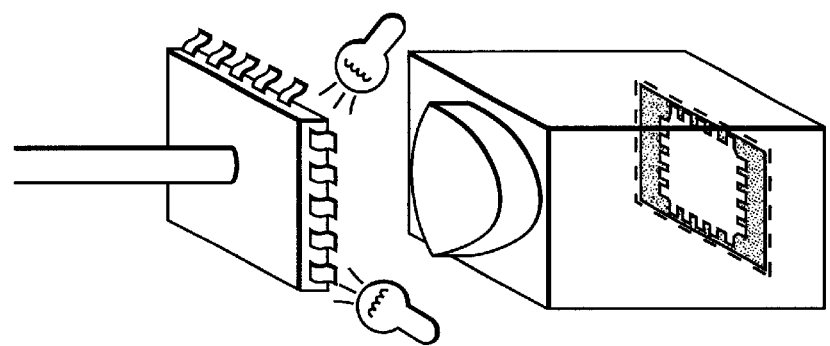
Figure 2:
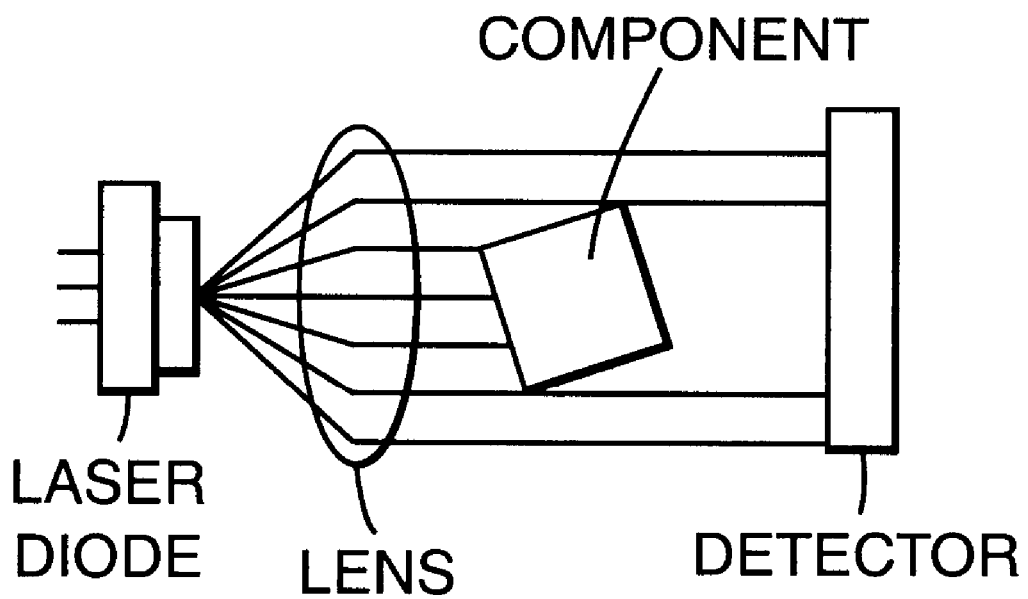
FIG. 2 shows a diagram of a prior art LaserAlign optical system for computing orientation of a component.
Figure 3A:
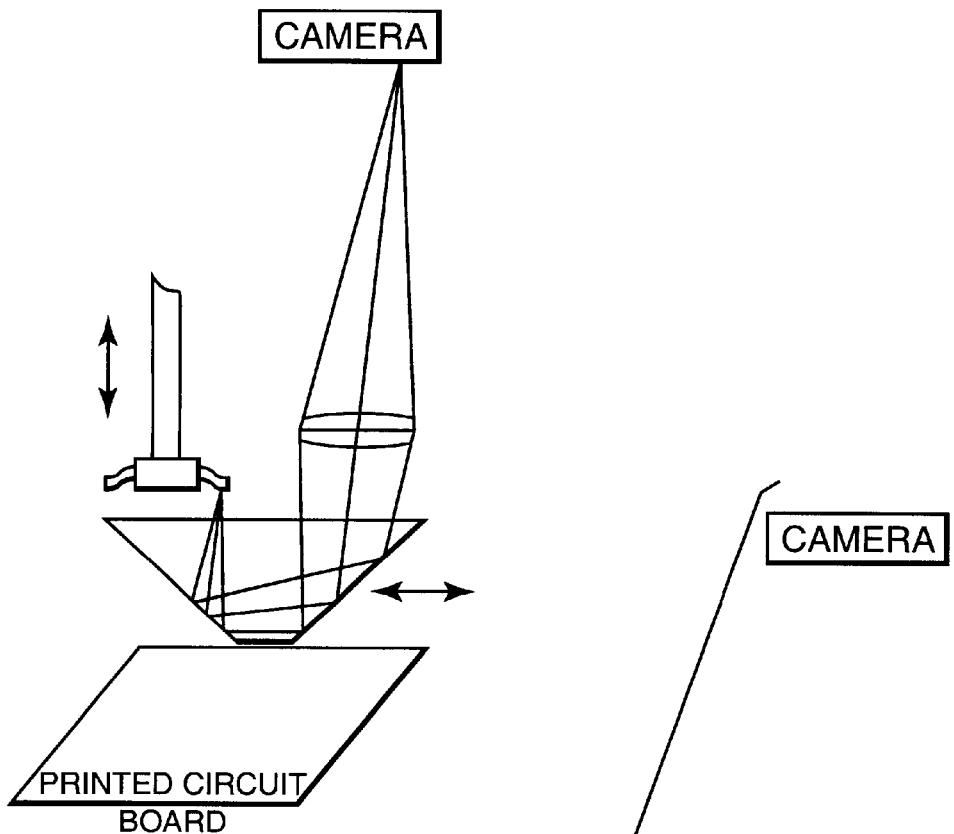
FIGS. 3A–B show diagrams of a prior art on-head video camera system.
Figure 3B:
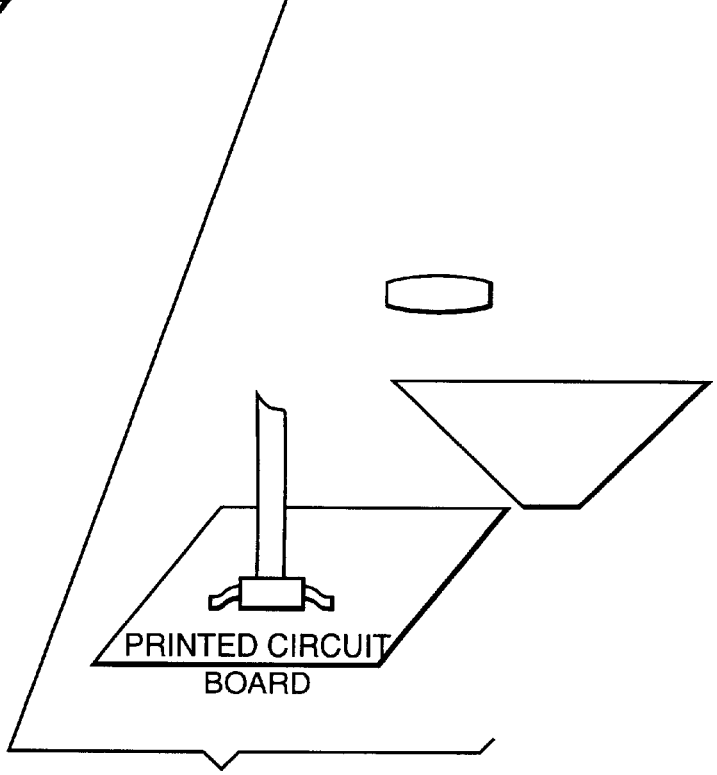
Figure 4:
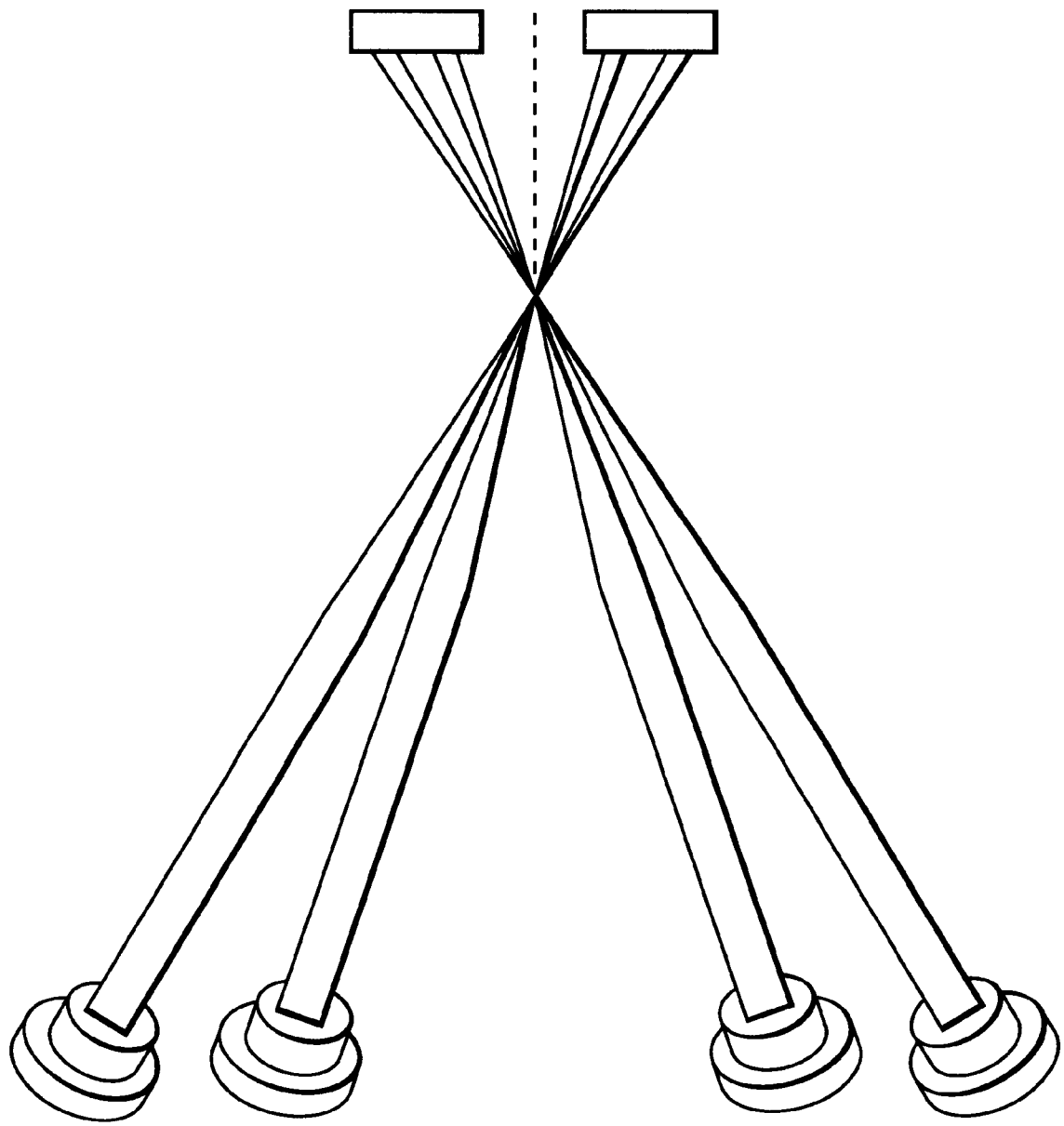
FIG. 4 shows a diagram of a prior art multiple source off-head system for assessing coplanarity.
Figure 5A:
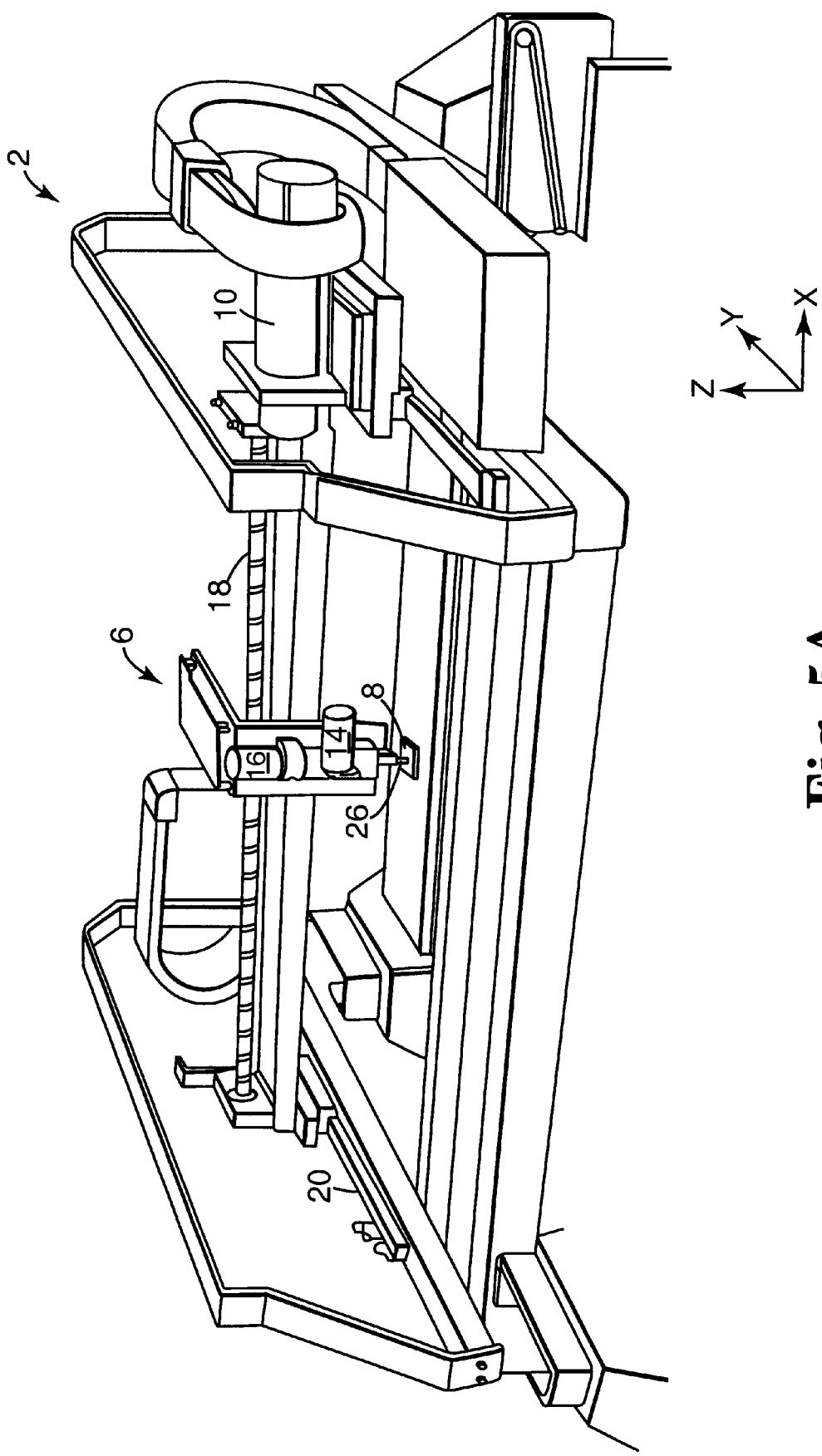
FIGS. 5A–B show diagrams of a pick and place machine adapted to practice the apparatus and method of the present invention.

The rotary scan camera with at least two detectors of the present invention is adaptable for use in determining the orientation of and performing inspection on any number of objects and articles of manufacture, and is well suited for use in the electronics industry. In the electronics industry pick and place machines, such as the one shown in FIGS. 5A–B, select an electronic component from trays or the like, pick up the component, use some sort of optical sensor for computing the orientation of the component, and then place the component onto a printed circuit board or the like. Depending on the complexity of the component and the likelihood that the component may be physically damaged, the pick and place machine may also inspect the component for physical damage before placing the component.

Figure 5B:
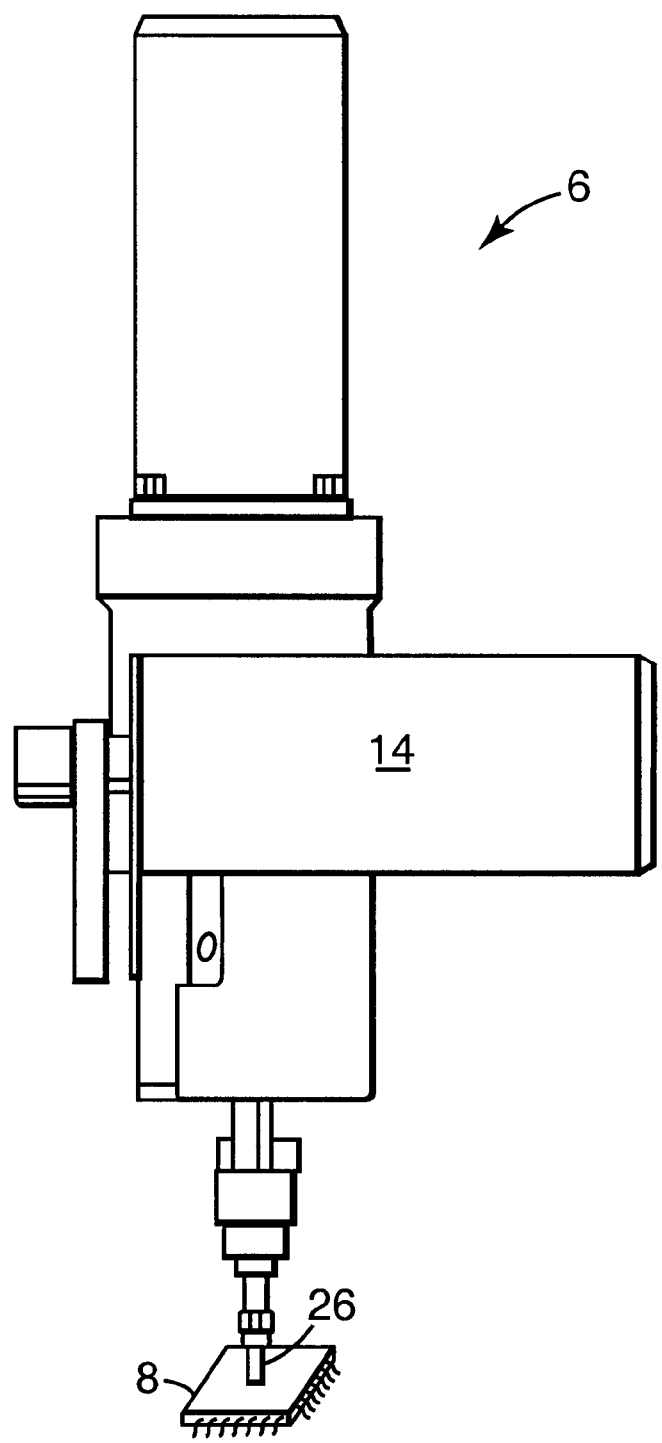

Pick and place machine 2 includes a head 6 for picking up component 8. A conveyor system (not shown) transports printed circuit boards in and out of machine 2. The head is linearly translatable in three directions (x,y,z) and must also have be capable of angularly rotating and elevating component 8, which movements are accomplished by an x head motor drive 10, y motor drive 12 (not shown in FIG. 5A), a z motor drive 14 and an angular motor drive 16. In pick and place machine 2, each motor runs independently from the others, by turning a threaded shaft which causes the head to slidably move along an appropriate gantry or slide, the (x,y) gantries or slide shown respectively at reference designator 18 and 20. A more detailed view of head 6 is shown in FIG. 5B, in which a quill 26 is mechanically mounted on head 6. In many pick and place machines, the quill is a hollow tube-like article and once the quill contacts the component, a vacuum is initiated to secure the component to the end of the quill.

Figure 6:
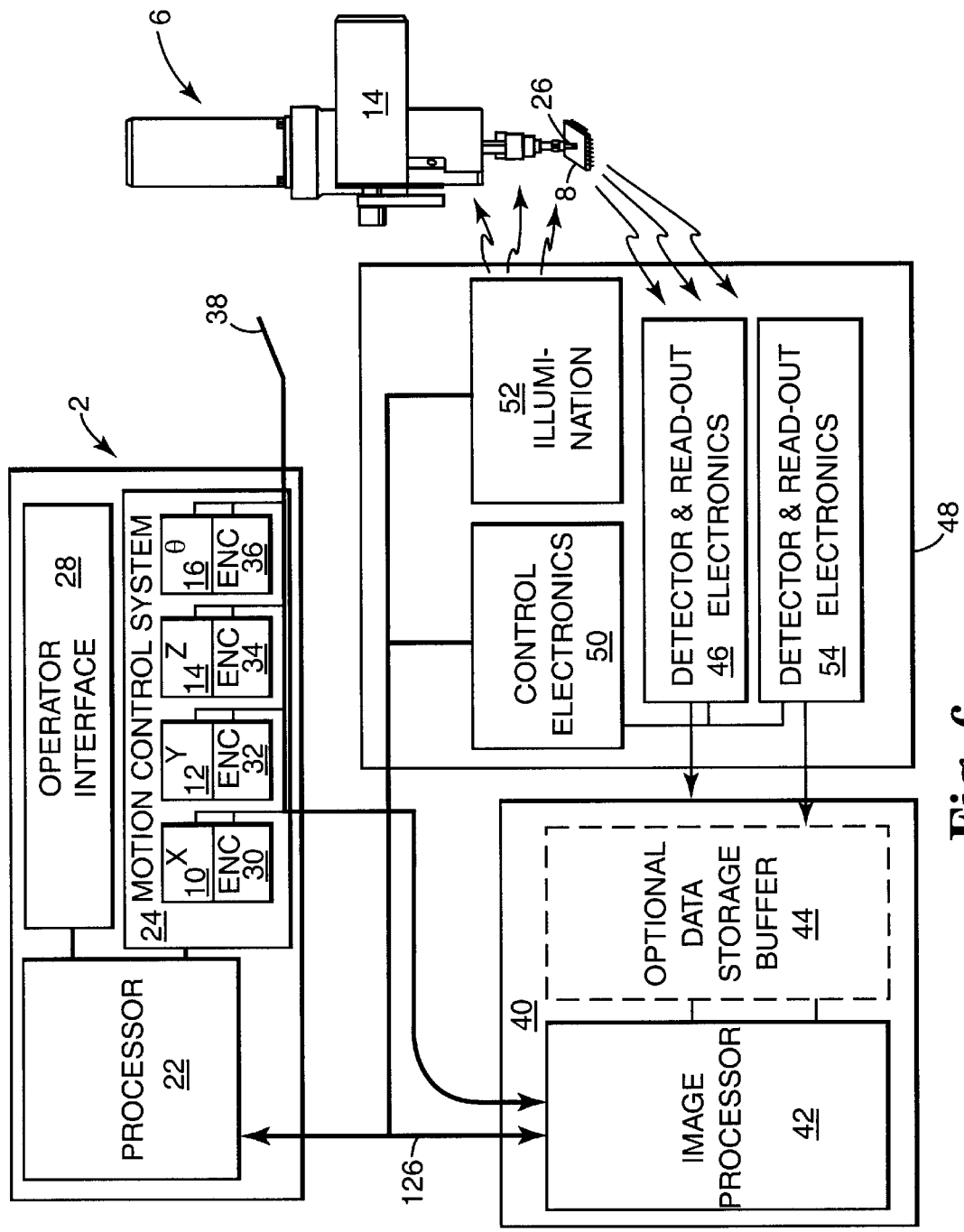
FIG. 6 shows a block diagram of the system of the present invention, including a pick and place machine, a sensor with two detectors and a quill holding a component.

As shown in FIG. 6, pick and place machine 2 also includes a host processor 22 for generally controlling the operation of machine 2 and a motion control system 24 which controls motors 10, 12, 14 and 16. Each motor has an encoder mechanically attached, each encoder adapted to independently output a signal representative of the x,y,z and θ position of head 6. The rotary motor 16 has particularly fine control in order to finely position components onto a printed circuit board, and the present invention incorporates the well-developed angular motion and control already present in the pick and place machine 2 in performing the method of the present invention.

Pick and place machine 2 also includes an operator interface 28 which typically includes a CRT for viewing images of the component provided by the present invention, or optionally viewing summary results of operation of machine 2. The x,y,z and θ motors 10–16 are electronically coupled to encoders 30–36. Processor 22 and motion control system 24, coupled electronically to head 6 via a bus 38, forms a closed loop control loop system for precisely locating head 6 in a desired sequence of locations, depending on the application. Host processor 22 also communicates design information about the component, such as the feature spacing or part type, to electronics 40 as necessary.

A set of processing circuitry 40 specific to the present invention may be located in pick and place machine 2, but may also be installed outside of the machine in a separate card cage (not shown). Processing circuitry 40 generally includes an image processor 42 and an optional data storage buffer 44 for storing images from detectors 46,54 within sensor housing 48. In a preferred embodiment of the intention, processing circuitry 40 is embodied in a dedicated processor CPU chip, such as an Intel® Pentium® processor and operates in real time to process images from detectors 46,54. Circuitry 40 may also be located in housing 48, as appropriate. In an alternative non real-time embodiment, processing circuitry 40 receives images from detectors 46,54 in data buffer 44 and stores the images until ready to assemble the images and compute the desired signal. In either embodiment, processing circuitry 40 assembles the images and computes a signal representative of the orientation of component 8, the location of certain features on component 8, such as the location of pins, columns, balls or leads (as appropriate for the component type in view), the absence of certain features on component 8, such as missing balls, columns, pins or leads, the distance between leads on a leaded component (e.g., lead tweeze), and the height and coplanarity of raised features on component 8 (as provided for in certain of the embodiments of the present invention). As all of the previously mentioned features are on the bottom of an appropriate type of component 8, it should also be understood that the invention can be practiced to view and locate any regularly placed identification marks or features on the top of a component or object which relate to the type of the object, its quality or its orientation.

Detectors 46,54 are positioned to view a stripe in a viewing plane near component 8. A set of control electronics 50 in sensor housing 48 provide a series of trigger signals to detectors 46,54 to acquire images of the same stripe. Detectors 46,54 are preferably linear CCD arrays commonly used in optical detection such as a 1024 or a 2048 pixel array. Any combination of these types, as necessary for the application or cost constraints, is appropriate. Control electronics 50 outputs trigger signals as a function of elapsed time or as a function of angular position of quill 26, and receives output from angular encoder 36 or instructions from processor 22. It is understood that the control electronics can function in either of these two modes, or a combination of the two according to the present invention. The number of images which the detector acquires is dependent on a number of factors in the application, including the size of the component, the proximity of the features on the underside of component 8, the desired resolution and the sensor geometry.

The present invention may be practiced without illumination 52 (assuming ambient illumination is sufficient), but in preferred embodiments of the invention, illumination enables faster acquisition of reliable data from detectors 46,54. Illumination may be of several types, and some types of illumination are more appropriate for certain embodiments, as discussed in detail in the description of certain embodiments. In FIGS. 7A–D, a preferred method and apparatus of the present invention is an off-axis configuration where detectors 46,54 view each feature from different directions, thereby providing the opportunity for information about the height and coplanarity of the features on components to be reported, in addition to x,y positions of features and of the component itself. In off-axis configurations, the detectors are outside the space defined by the outline of the component. It will be understood that both detectors as shown in FIGS. 7A–D may reside in a common linear array. For example, detectors 46,54 may be located in a 4096 pixel array, with pixels 1–2048 dedicated to functioning as detector 46 and the remainder of the array dedicated to functioning as detector 54. Alternatively, each of the detectors 46,54 could be embodied in a separate linear array with the arrays packaged together. An observation plane 312 is formed between detector 46 and stripe 66 and another observation plane 313 is formed between detector 54 and stripe 66, observation planes 312,313 coincident with a central axis of rotation 316 of quill 26. One type of illumination is front-lit, an example shown in FIG. 7A, where the light source is a plurality of LEDs 62,62 positioned to illuminate the area of interest on the bottom of component 8.

It is understood that two different widths of detectors 46,54 (the word "width" relates to the number of pixels which the detector uses to image the width of the stripe) may be used in any embodiment of the present invention: the first width corresponding to a radially oriented stripe in FIGS. 7A–D, and the second corresponding to a cross-component stripe as shown later. When the first type of detector is used in any off-axis embodiment of the present invention, the stripes must image the component over substantially 360 degrees of rotation in order to image all the features. When the second type of detector is used, the stripes only need to image over 180 degrees of rotation in order to image all the features.

The embodiment of FIGS. 7A–D is preferred over other off-axis configurations, because, regardless of the z position of component 8 with respect to stripe 66, acquiring data over the appropriate angular rotation for the embodiment provides information about all the features. Furthermore, it is easier to locate the same physical point in the output from the two detectors than in other embodiments, since the same physical point is found at the same angular position in each detector output.

One advantage of those embodiments which have a detector positioned substantially directly underneath the component is that the image of feature locations are independent of their respective z positions. For example, locating a raised feature such as a pin does not require any height calculations (which require finding the pin in two images).

Figure 7B:
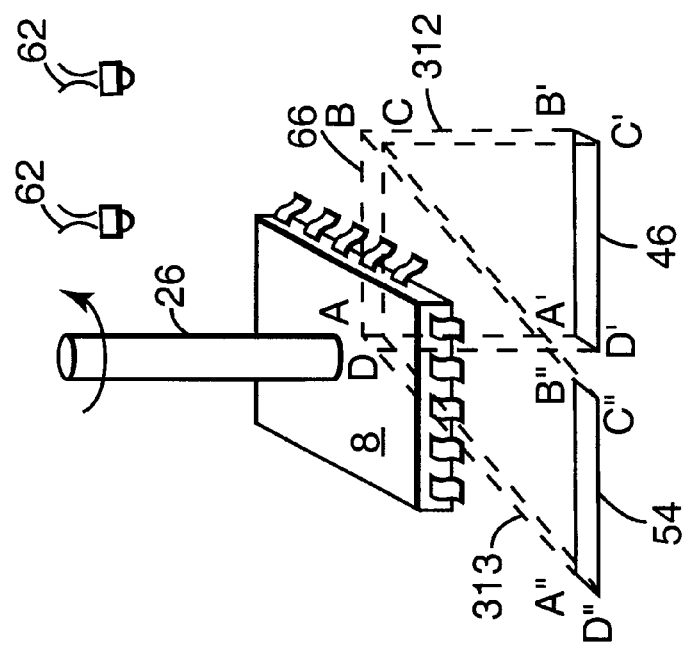
Figure 7A:
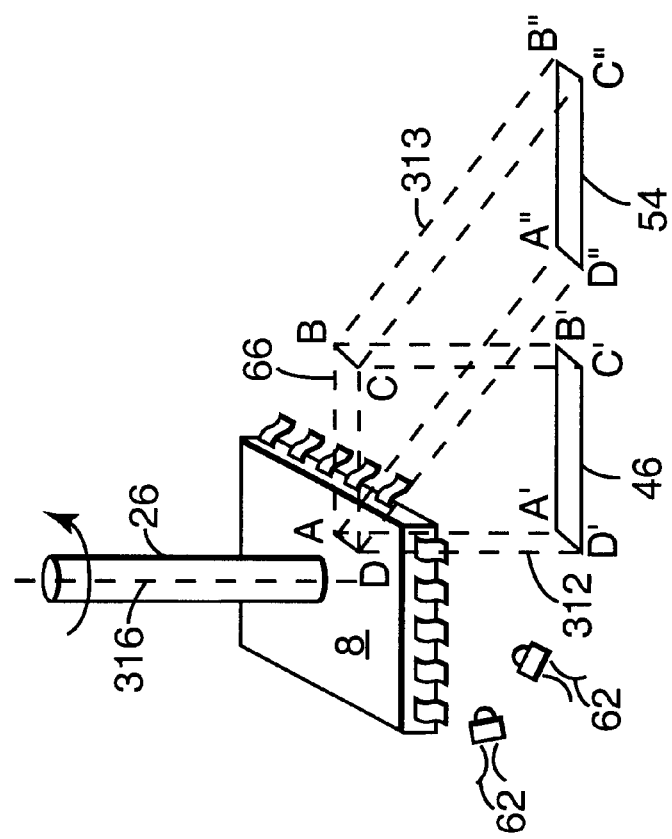

Additional FIGS. 7B–D show back-lit, front-lit specular and back-lit shadow casting illuminations respectively. An optional imaging lens system is omitted from all embodiments of the invention, including FIGS. 7A–D, for clarity. The imaging lens system functions to image stripe 66 onto detectors 46,54. For the configurations of the present invention shown in FIGS. 16A–D, the preferred embodiment of the imaging lens system is a gradient index (GRIN) lens array. The word "image" as used in this document includes a shadow image formed by light blocked (or attenuated) by an object (in this case, the component) and light not blocked (or attenuated) by the object. Furthermore, it is understood that the embodiments shown are compatible with various types of illumination, even though not specifically shown herein.

Figure 8:
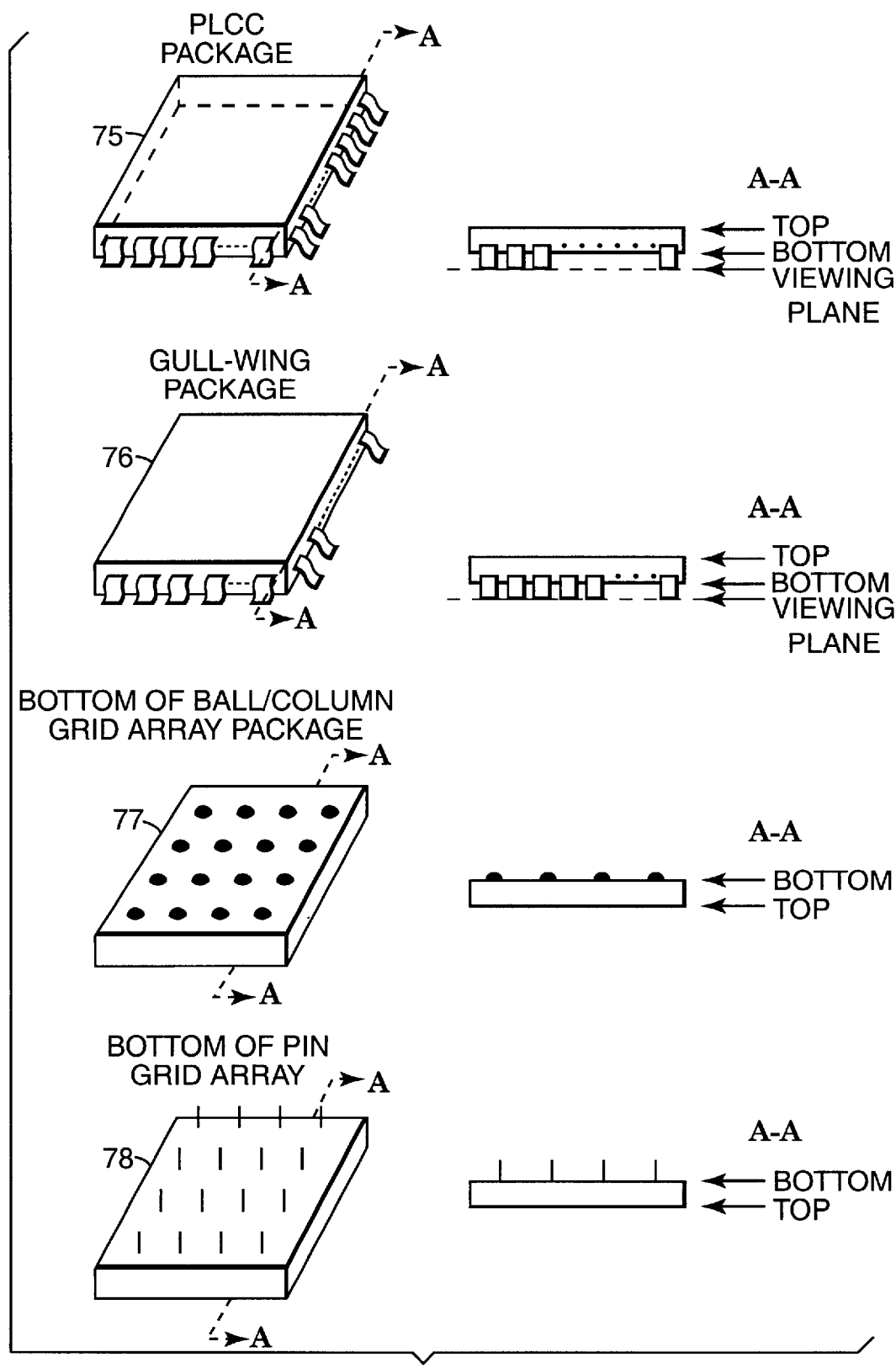
FIG. 8 shows diagrams of various types of components for use in the present invention, including leaded components, ball and column grid array packages and pin grid array packages.

The present invention can be used with any type of object, and component 8 is shown as an example. Within the electronics assembly industry, the present invention may be used with resistors, capacitors and the like. FIG. 8 shows four different types of components: leaded components such as PLCC 75 and Gull-wing package 76, ball grid array (BGA) 77 and column grid array (CGA) package (not shown), and pin grid array (PGA) package 78. Each type of package 75–78 includes a sectional view of the side of the package, with the top, bottom and the viewing plane identified. Other examples of leaded components are Quad Flat Packs (QFPs) and Thin Small Outline Packages (TSOPs), while flip-chips are treated the same as BGA-style packages. When the present invention is applied to acquiring information related to raised features on the package, such as coplanarity or height of a feature in a PGA, CGA or BGA package, the detector views a plane (i.e., the "viewing plane") defined by the tips of the raised features. Otherwise, the physical bottom (or top as applicable) of the package is the viewing plane which detectors 46,54 image.

Figure 9A:
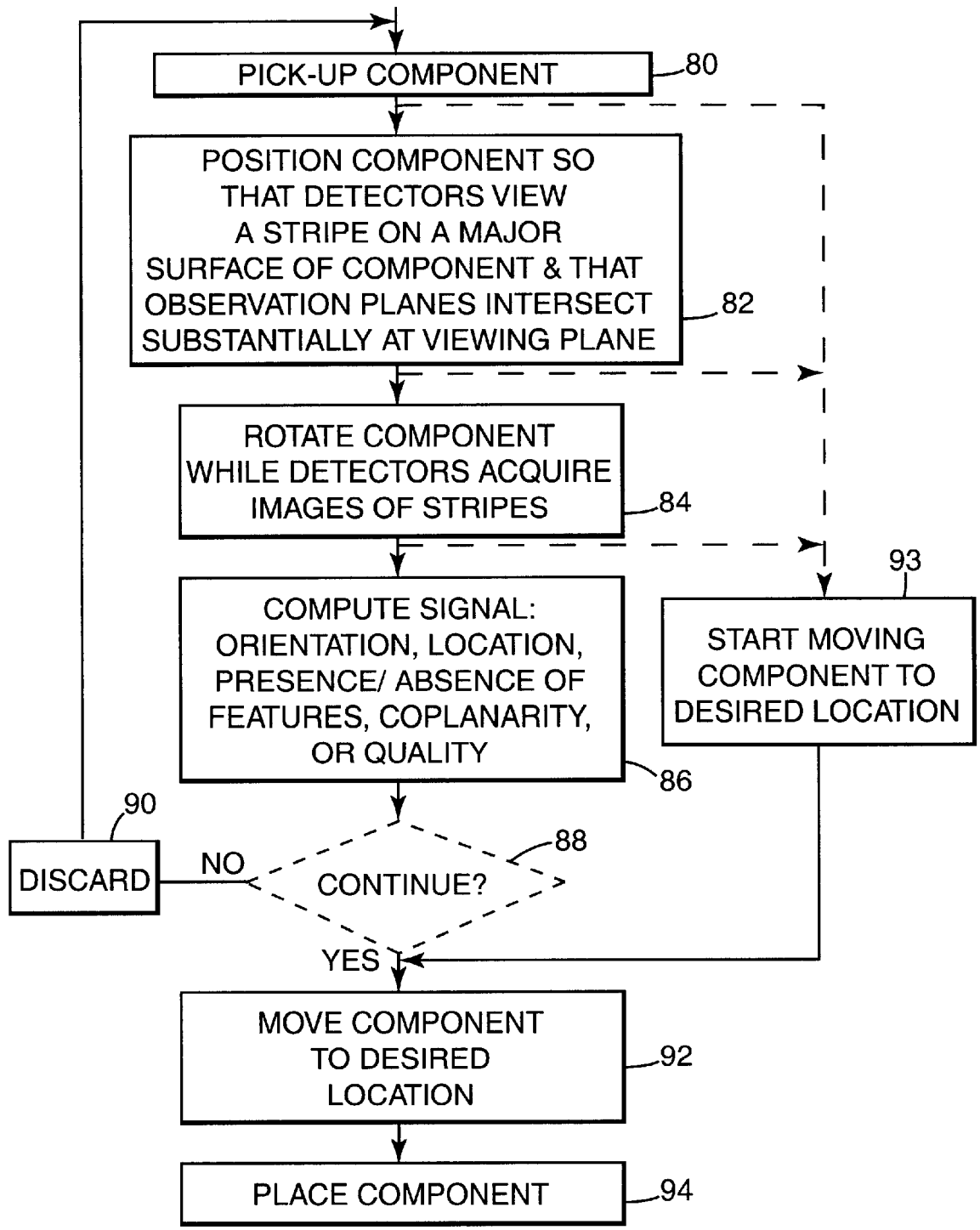
FIGS. 9A–B show flow-charts of the method of the present invention as used on-head and off-head, respectively.
Figure 9B:
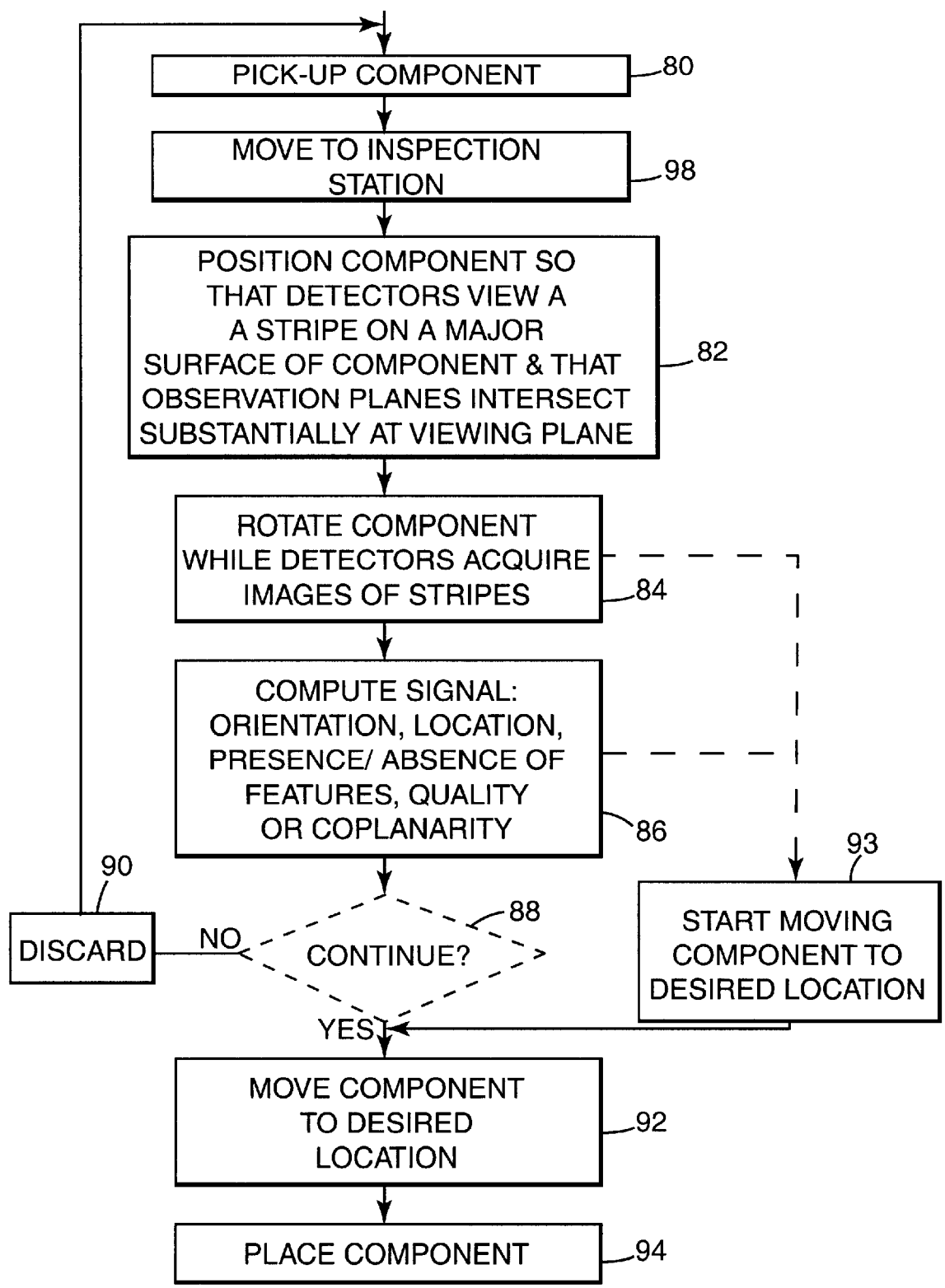

FIGS. 9A and 9B show the methods of the present invention, for on-head and off-head placement, respectively. Each of these methods may include optional initialization steps for preparing to pick-up the component (not shown). FIG. 9A shows block 80, where quill 26 picks up component 8. In block 82, quill 26 positions component 8 with respect to detectors 46,54 so that both detectors view the same stripe 66 in the viewing plane perpendicular to the central axis, typically accomplished by host processor 22 issuing instructions to motion control system 24 to cause quill 26 to position component 8. Component 8 may be optionally rotating at this point, in order to minimize the amount of time taken to place a component. In any event, component 8 is rotating about the central axis when control electronics 50 sends trigger signals to detectors 46,54 to cause the detectors to acquire an image of a stripe 66, as shown at block 84. In real time when the application requires, processing circuitry 42 receives a plurality of images of stripes and depending on the desired sort of signal, computes a signal representative of a physical condition of component 8, as shown in block 86. Optional block 88 shows a decision point for processor 22, where the processor can decide to discard this component and pick up another, if the signal is representative of the quality of component 8 and indicates that the component is unacceptable and should be discarded (block 90). Because many of the components with large numbers of connections on them (pins, leads, columns or balls) are costly, it is important to place them precisely onto the printed circuit board. Including a decision block here in the process of placing a component also limits re-work done later in the process of manufacturing printed circuit boards. Block 93 indicates that the head 6 starts moving toward the board, and the dotted lines in the figure indicate by their placement that this step could start at any time after picking up the component. The words "move" or "place" as used throughout this document is intended to encompass any slidable or rotatable movement, and would include orienting the part in anticipation of placement and should be construed to include a pause or minimal re-direction of the object being moved. In block 92, processor 22 instructs motion control system 24 to move component 8 to the desired placement on a printed circuit board, which would also necessarily include orienting the component according to the signal, for precise placement on the board. Finally, component 8 is placed on the printed circuit board in block 94.

FIG. 9B shows an off-head placement method of the present invention where the component is picked-up (block 80), and then moved to an inspection station to acquire any information about the orientation of the part (block 98). In this process, the step of orienting the part is performed sometime before placement and not necessarily simultaneously with the movement of the head toward the target printed circuit board, as it is in the method of FIG. 9A. Blocks 82, 84, 86, 88 and 90 have the same purpose and function as described previously. At block 92, the component is moved to the desired location, which would also include orienting the part in anticipation of placement. At block 93 movement in the general direction of the board may begin at any time after the completion of the step in block 84. Finally, at block 94, the component is placed on the board. Off-head placement systems are less complicated mechanically, simpler to maintain and are less costly than on-head systems, since it is unnecessary for the sensor to travel with the head.

Figure 10C:
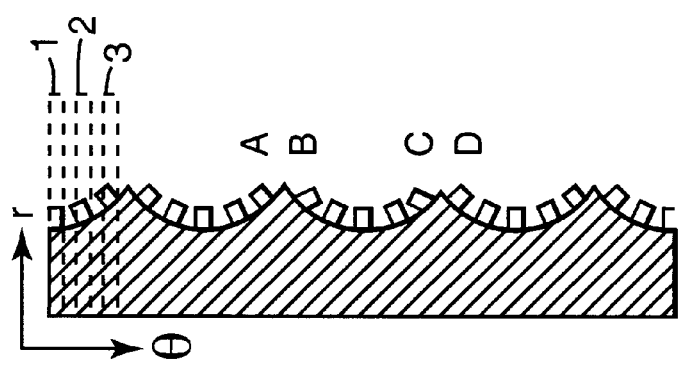
FIGS. 10A–D show a timed sequence of plan-view sketches of radially oriented stripes, two corresponding polar images and Cartesian image of the component, respectively.
Figure 10B:
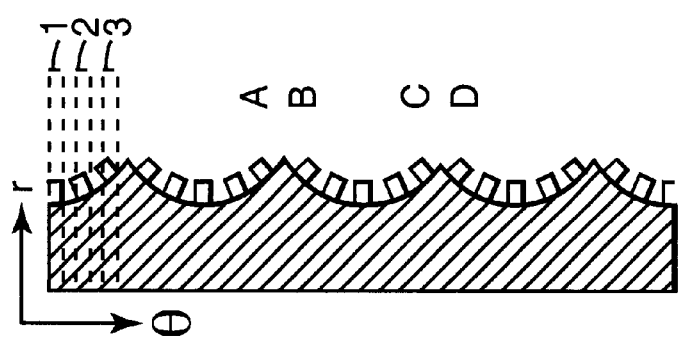
Figure 10A:
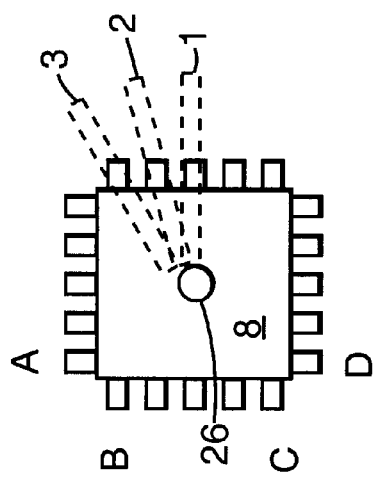

FIG. 10A shows a time sequence of the location of the stripes viewed by detectors 46,54 while component 8 rotates. In this embodiment of the invention, the detectors are positioned to view a radially oriented stripe which has one end towards the center of component 8 and the other end, in general, off of component 8. These stripes include the perimeter of component 8, which is the area of interest for a leaded component. The first stripe acquired viewed an area on the component located at 1, a second stripe located at 2 and a third stripe shown located at 3. Any number of stripe views can be taken by the detectors 46,54, but in general 15,000 stripes for a 50 mm size leaded component is sufficient to achieve 14 micron resolution at the corners. For the purpose of orienting the component, fewer stripes may be acquired. The minimum number of stripes acquired when the purpose is to orient the component would be two stripes which show leads on opposing sides of the component, since this allows the orientation of the part to be computed. Leads A, B, C and D are indicated on the sequenced sketch of component 8.

Figure 10D:
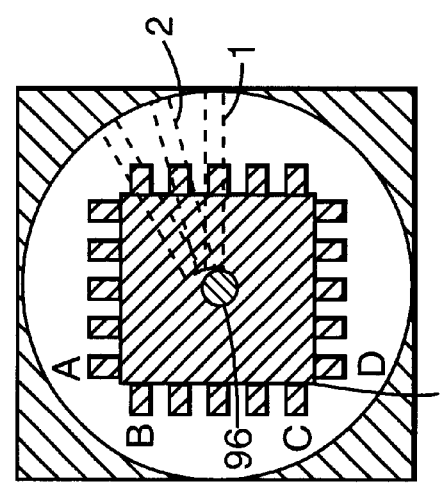

FIGS. 10B–C show polar arrays including lines of output from detectors 46,54, respectively, each line representing an entire output of the appropriate detector. Each line of output in the array corresponds to a particular angular position of quill 26. The leads A–D are labeled in each of FIGS. 10A–D, as are stripes 1–3. The lead B is bent downwards while lead C is bent upwards, as seen in FIG. 10C, which corresponds to detector 54 (in FIG. 7A, for example), which views the stripe from an angle. FIG. 10D shows a Cartesian image of component 8, after processing circuitry 40 assembles and computes a signal representative of a physical condition of component 8. There is a hole 96 in the image, because the end of stripe 66 closest to the center of the component was offset from the center of rotation 316 of component 8. The interior of hole 96 indicates where the present invention provides no data about component 8.

Figure 11A:
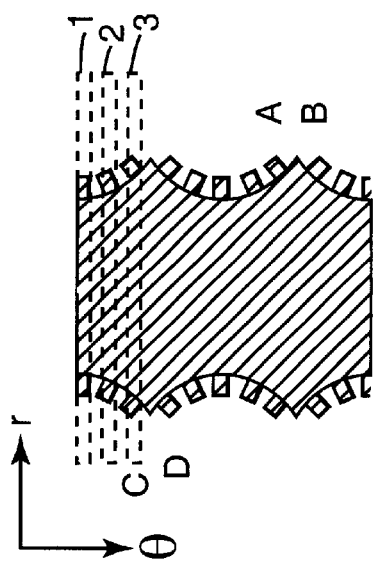
FIGS. 11A–D show a timed sequence of plan-view sketches of cross component stripes, two corresponding polar images and Cartesian image of the component, respectively.

FIG. 11A shows a plan-view time sequence of the location of the stripes viewed by detectors 46,54 while component 8 rotates. In this embodiment of the invention, detectors 46,54 are positioned to view a stripe which generally includes two edges of component, and its center, so that stripe 66 views across the component. The lengths of detectors 46,54 in this embodiment are substantially twice the length of the detector used to provide the data in FIGS. 10A–D, since the stripe 66 which this embodiment views is approximately twice as long. It will be understood that either type of detector may be used interchangeably, as long as processing circuitry is modified appropriately.

Figure 11B:
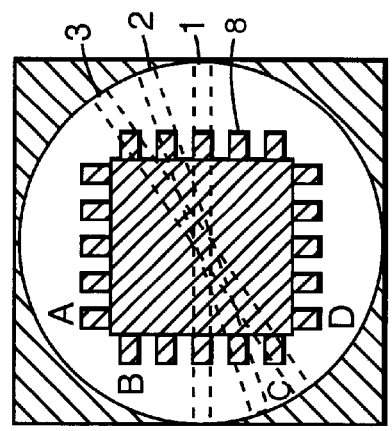
Figure 11C:
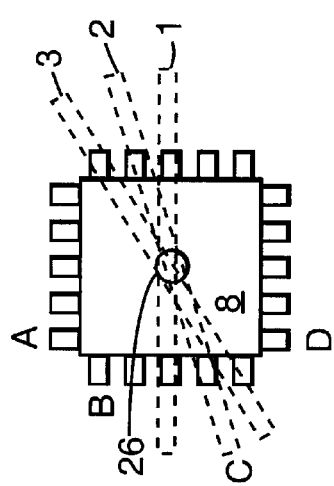
Figure 11D:
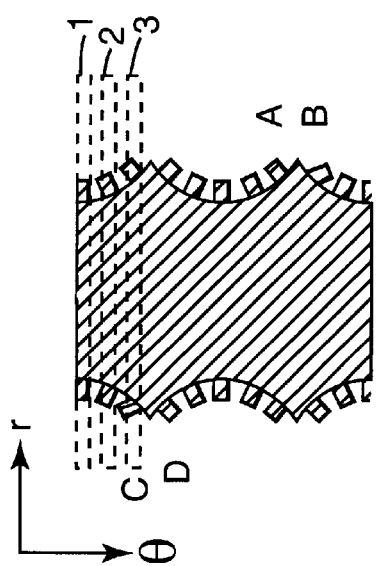

FIGS. 11B–C show polar arrays including lines of output from detectors 46,54, respectively, each line representing an entire output of the appropriate detector. Each line of output in the array corresponds to a particular angular position of quill 26. The leads A–D are labeled in each of FIGS. 11A–D, as are stripes 1–3. The lead B is bent downwards while lead C is bent upwards, as seen in FIG. 11C, which corresponds to detector 54 (in FIG. 7A, for example), which views the stripe from an angle. FIG. 11D shows a Cartesian image of component 8, after processing circuitry 40 assembles and computes a signal representative of a physical condition of component 8.

Figure 12A:
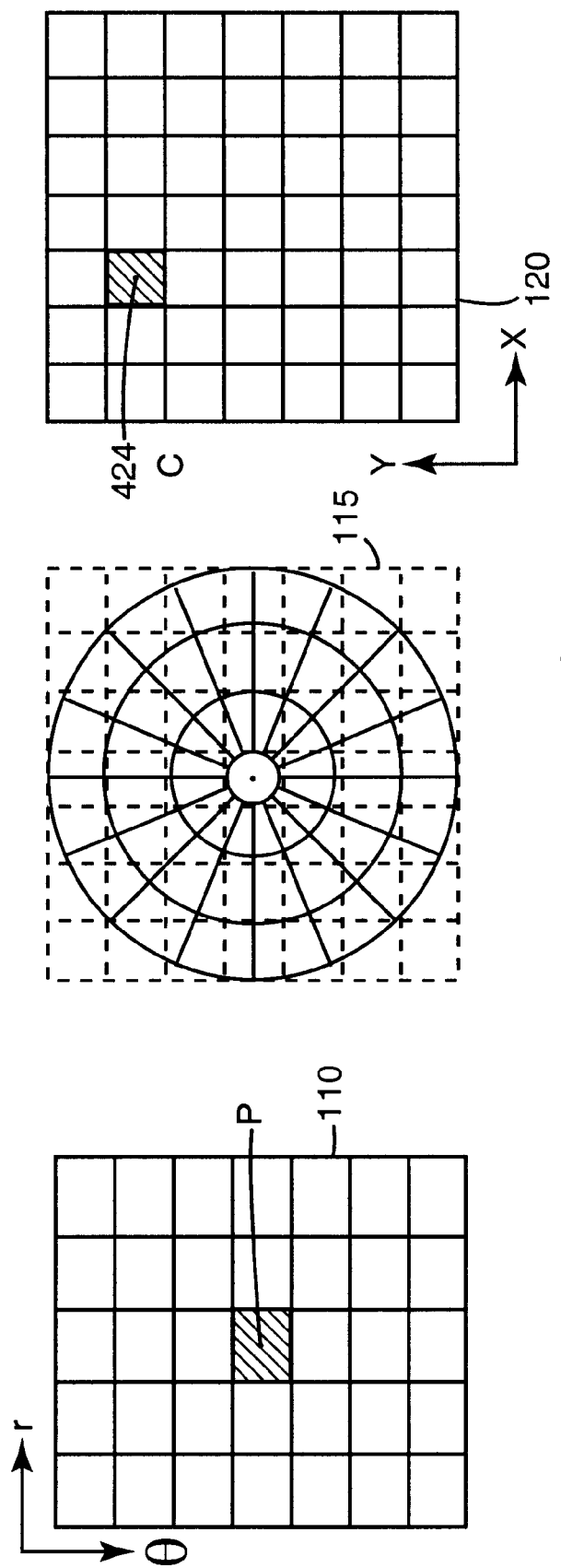
FIGS. 12A–B show three sketches of a Cartesian array, a mapping sketch showing how polar data maps to Cartesian space and a polar array, and a flow chart for converting from a polar data array into a Cartesian data array, respectively.
Figure 12B:
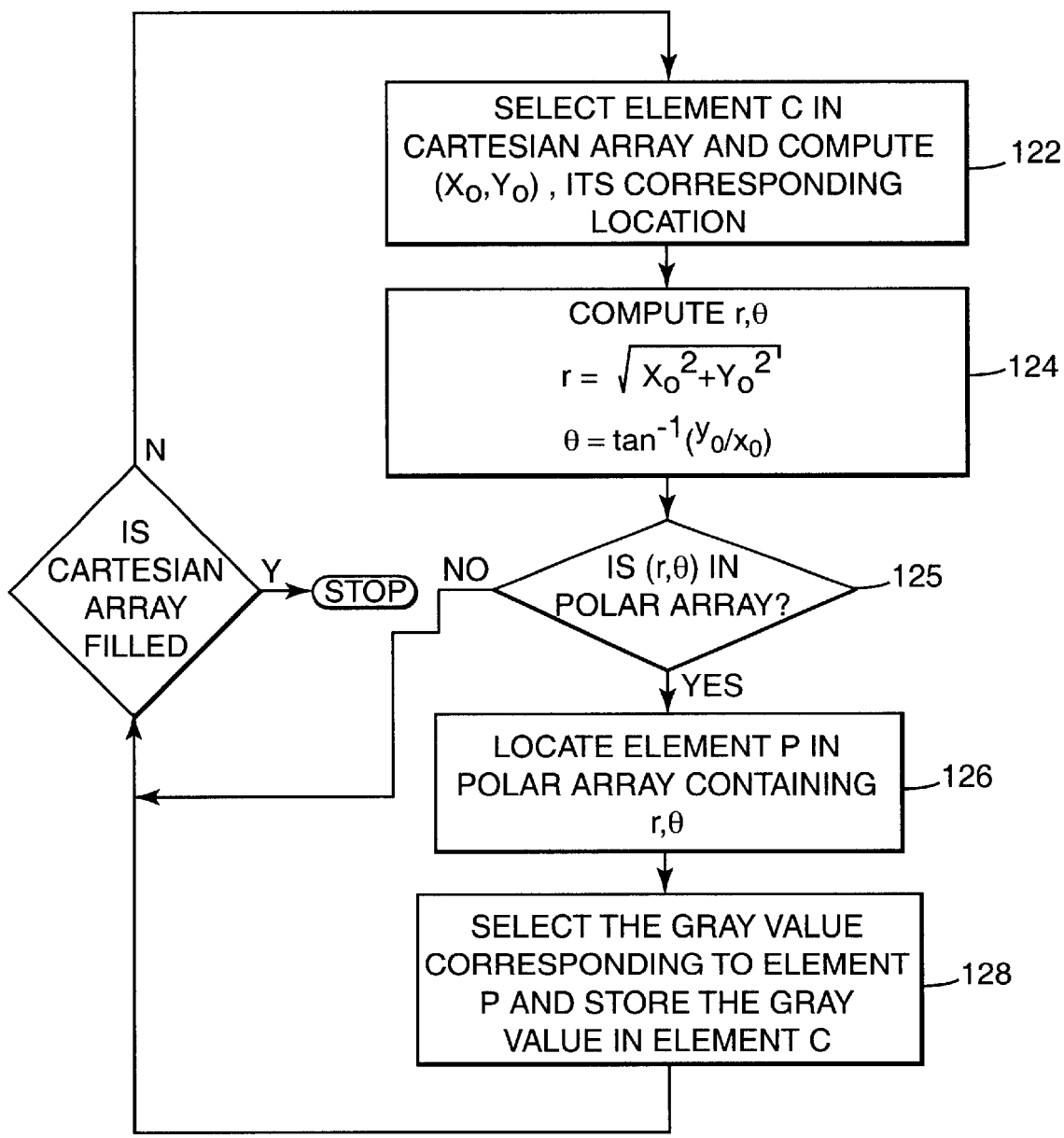

In FIG. 12, polar array 110 has multiple elements, each representing a location in the array. Each line of polar array 110 represents an entire output of one of the detectors. (The detectors are not drawn to scale, and are somewhat shorter for the purposes of illustration. In practice, each would have 1024 or more elements.) Similarly, Cartesian array 120 shows multiple elements, each representing a location therein. A gray value representative of one pixel from one of the detectors is stored within each of the elements of polar array 110. Each point in each of the arrays corresponds to a unique point in the viewing plane, but there is not a one-to-one correspondence between polar and Cartesian elements. Diagram 115 shows a mapping of polar array 110 onto Cartesian array 120.

The optional process of converting from polar array 110 into Cartesian array 120 is shown in the flow chart for a system with one of the detectors positioned substantially directly underneath component 8. The first step is to select a target element of the array 120 which corresponds to a point ($x_0, y_0$) (reference designator 424), in array 120 (block 122), followed by computing the polar coordinates (r,θ) corresponding to the point 424 (block 124). Assuming no detector offset, the polar coordinates are computed as:

$$r = \sqrt{x_2^0 + y_0^2} \quad (1)$$

$$\theta = \tan^{-1}\left(\frac{y_0}{x_0}\right) \quad (2)$$

Once the (r,θ) values are computed, processing circuitry 40 determines if point (r,θ) is contained in the polar array. If it is, processing circuitry 40 locates the target element of array 110 which contains point (r,θ) (block 126). In block 128, the circuitry stores the gray value which corresponds to point (r,θ) into the target element of the Cartesian array. A variety of algorithms may be employed to locate an appropriate gray value, including a nearest neighbor and a linear interpolation algorithm, although the present invention is not limited to these algorithms. This process continues, until the Cartesian array 120 is filled to the extent necessary for computing the signal of interest (block 130).

Regardless of the algorithm employed for the optional conversion, processing circuitry 40 operates on the collected images, to provide a) the orientation of component 8; or b) the location of certain features on component 8, such as the location of balls, pins, columns or leads (as appropriate for the component type in view); c) the absence of certain features on component 8, such as missing pins, balls, columns or leads; d) the distance between leads on a leaded component (e.g., lead tweeze); or e) the height or coplanarity of features on component 8. To determine the orientation of component 8, a minimum of two opposing features must be located and design information about the type of component must be retrieved from processor 22. In general, however, orientation is computed based on the location of many features. The orientation may be based, for example, on minimizing the worst case or root mean square differences between the measured feature locations and their expected locations. Computing the orientation or location, once the Cartesian or polar array is known, is a matter well known to those skilled in the art. The distance between leads on a leaded component is computed in two dimensions by computing the distance between at least two points in an array corresponding to the desired leads. The height of a desired feature on a component is computed as discussed below. The coplanarity of features on a component may also be computed. In this computation, a reference plane is selected which is defined by at least three of the features (balls, columns, pins or leads) and the deviation of any particular feature from the plane is computed and reported, although in many instances the deviation, computed as an average, standard deviation or the like, is compared to a threshold value to determine whether the component should be discarded or placed. Methods for determining the reference plane may be based on the well-known JEDEC seating plane and the best fit plane to the features.

Creating a Cartesian array is computationally intensive. It may be preferable to identify features in polar coordinates and convert only this set of feature locations to Cartesian coordinates. This conversion is accomplished by computing:

$$x = r \cos \theta \quad (3)$$

$$y = r \sin \theta \quad (4)$$

Where (r,θ) is the location of the feature in polar coordinates and (x,y) is the location of the same feature in Cartesian coordinates. These equations are used in conjunction with either equations (5) and (6) for embodiments of the geometry shown in FIGS. 7A–D or Equations (7) through (12) for embodiments of the geometry shown in FIGS. 16A–D to compute the x,y,h position of selected features.

Figure 13:
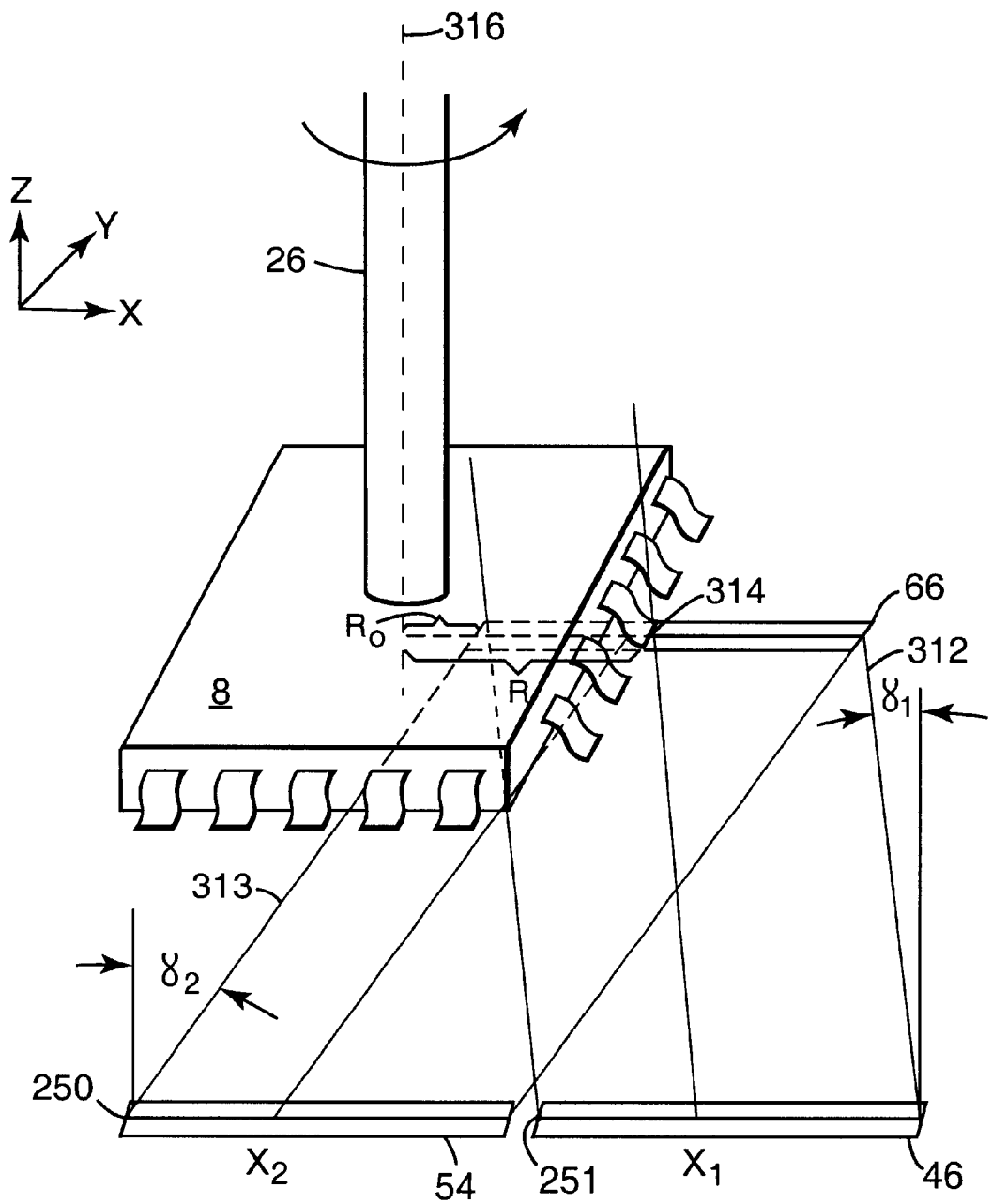
FIG. 13 shows the embodiment shown in FIGS. 7A–D, with more detail shown so as to discuss a calculation of height.

FIG. 13 shows an off axis configuration where heights of raised features may be computed because there are two views of each feature, each view taken from a different direction. The feature will be observed on detectors 46 and 54 at the same rotation angle, but the feature may appear at different positions on the detector. In FIG. 13, detectors 46,54 have origins at points 251 and 250 respectively. Feature 314 is observed on detector 46 at position $x_1$, and at position $x_2$ on detector 54. Detector 46 views stripe 66 from an angle $\gamma_1$ where $\gamma_1$ is measured from normal viewing, and is negative in the orientation shown in FIG. 13. Detector 54 views stripe 66 from an angle $\gamma_2$ where $\gamma_2$ is measured from normal viewing, and is positive in the orientation shown in FIG. 13. The reference plane is defined as the height where feature 314 would be observed at the same location on detectors 46 and 54. The height, h, from the reference plane is given by:

$$h = \frac{x_1 - x_2}{\tan \gamma_2 - \tan \gamma_1} \quad (5)$$

Stripe 66 is offset from the central axis 316 by a distance $R_0$. The distance, R, of feature 314 from a central axis 316 is given by:

$$R = R_0 + x_1 - h \tan \gamma_1 \quad (6)$$

Figure 14:
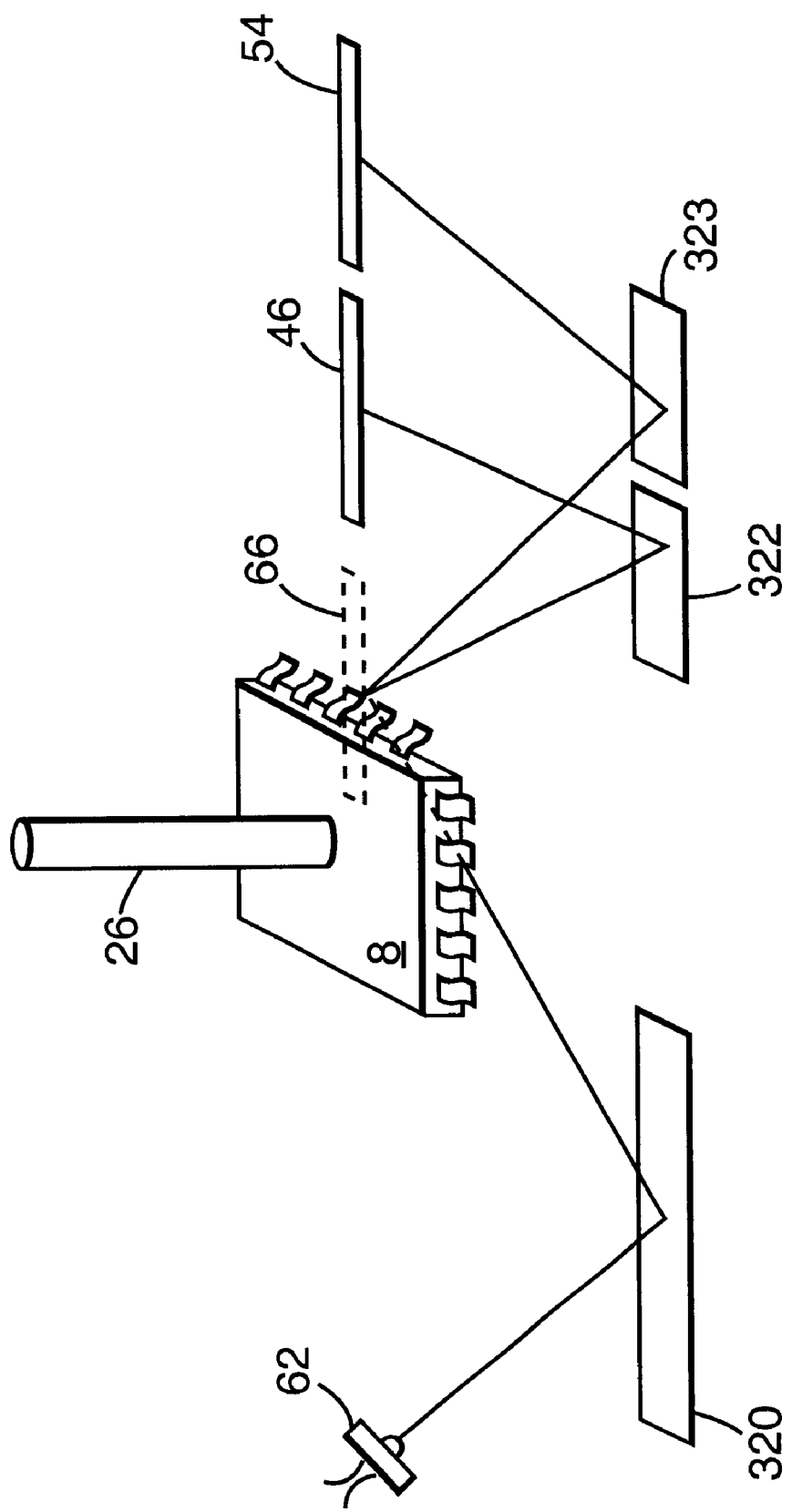
FIG. 14 shows the embodiment shown in FIGS. 7A–D, with mirrors interposed in the transmit and receive paths.

FIG. 14 shows a more compact version of the embodiment shown in FIGS. 7A–D. A mirror 320 is positioned in the transmit optical path between source 62 and component 8, and mirrors 322,323 are positioned in the receive optical path between component 8 and detectors 46,54.

Figure 15:
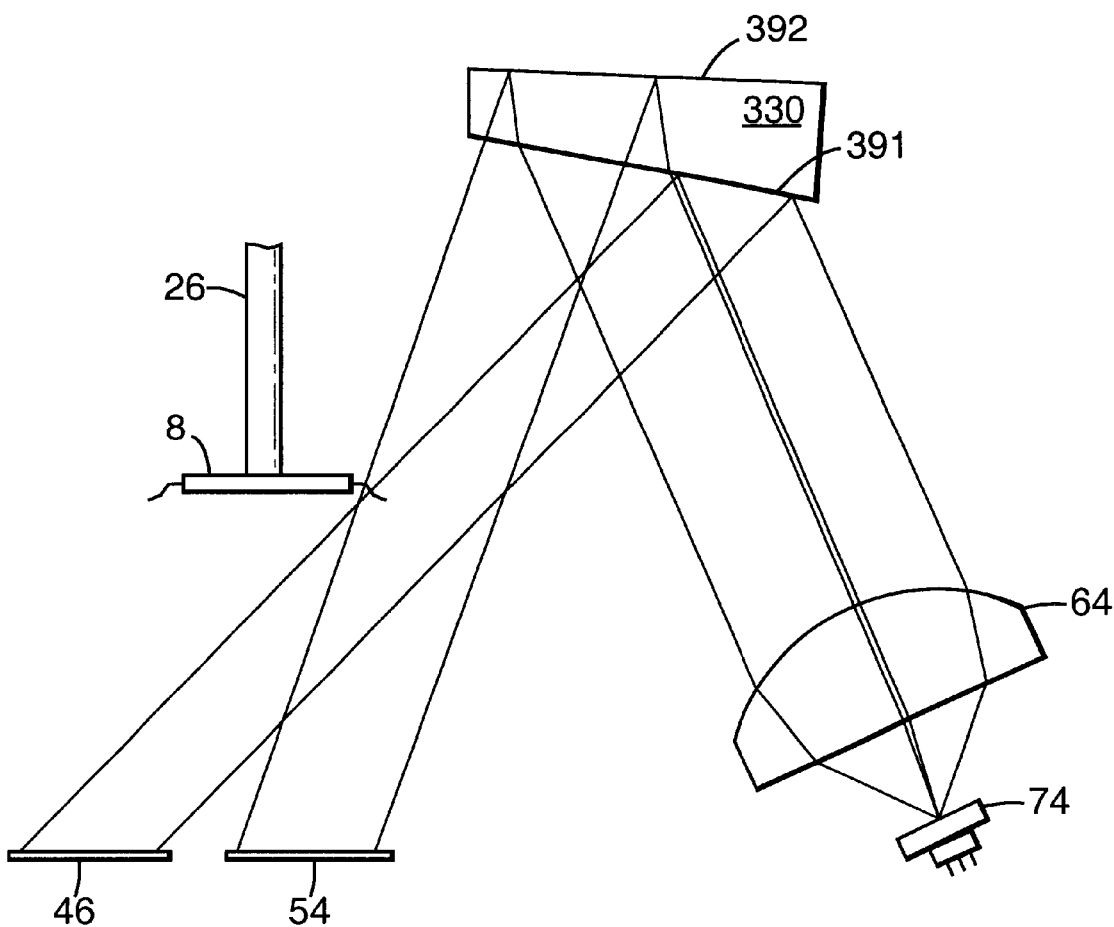
FIG. 15 shows another embodiment of the present invention including a prism positioned above the component.
Figure 16B:
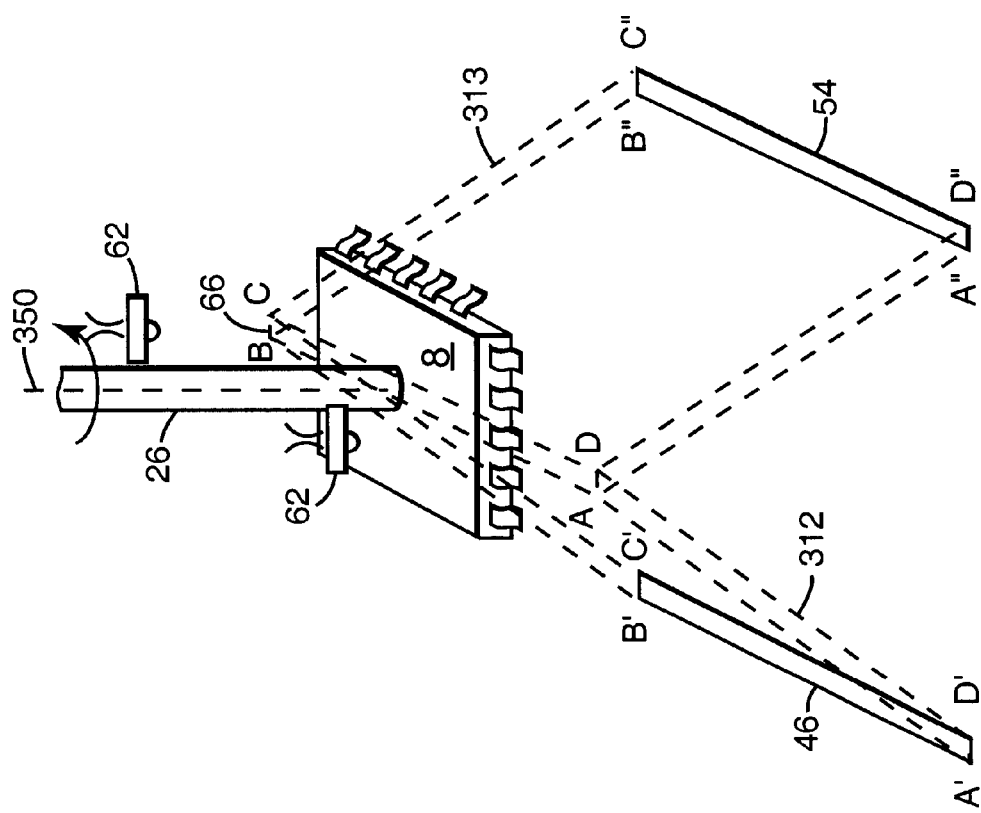
FIGS. 16A–D show front-lit, back-lit, front-lit specular and shadow casting illuminations, respectively, for another embodiment of the present invention.
Figure 16A:
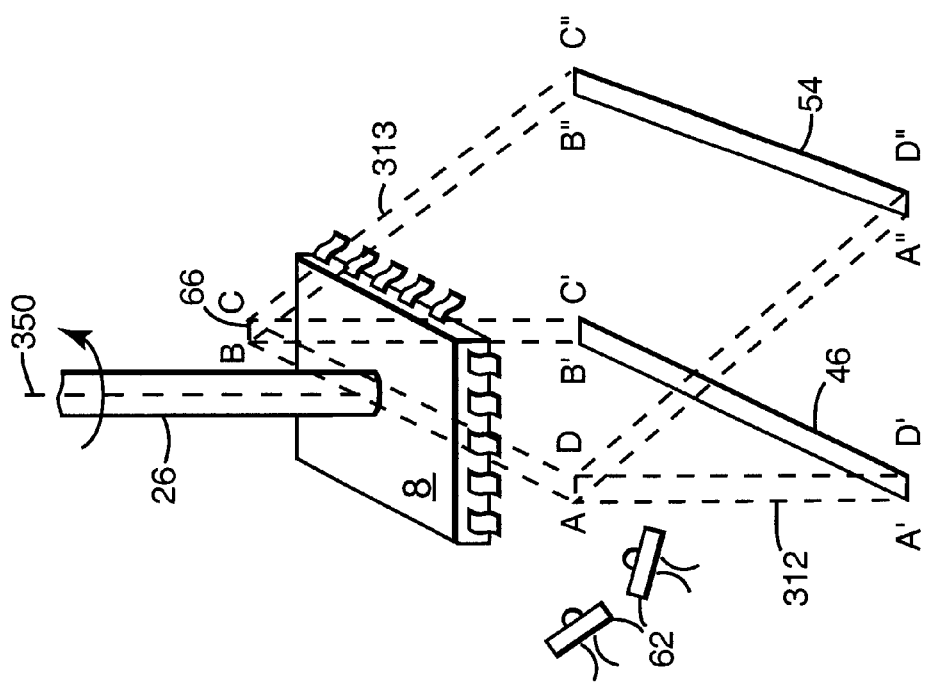
Figure 16D:
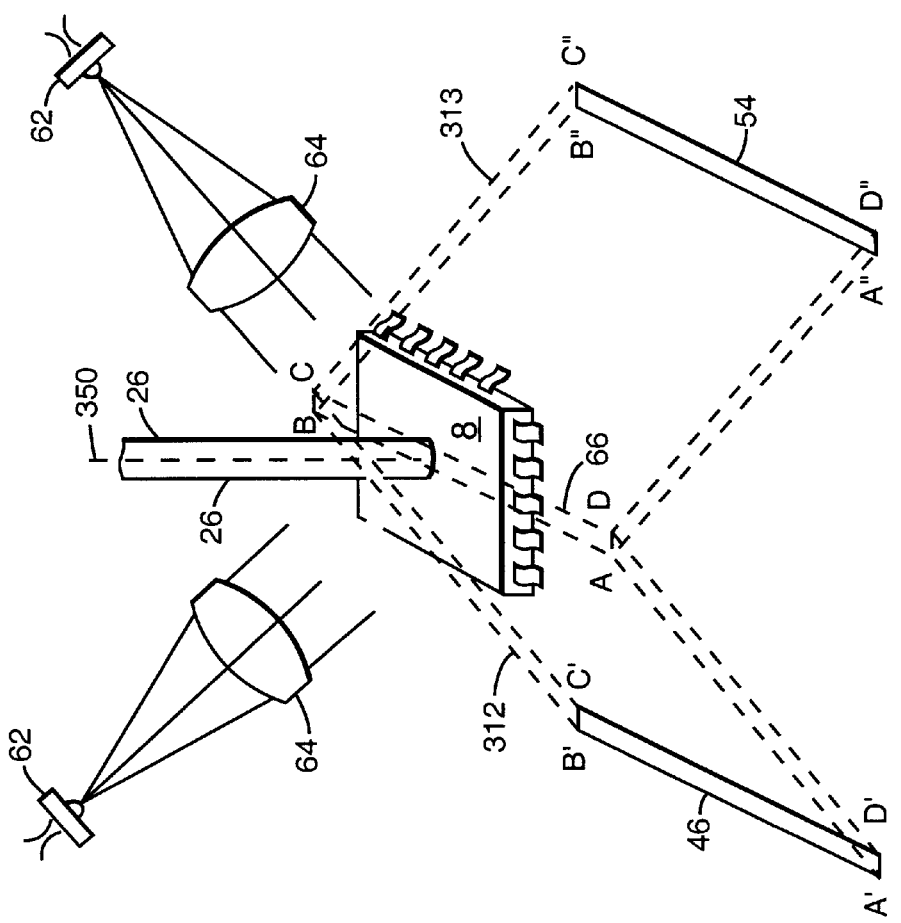
Figure 16C:
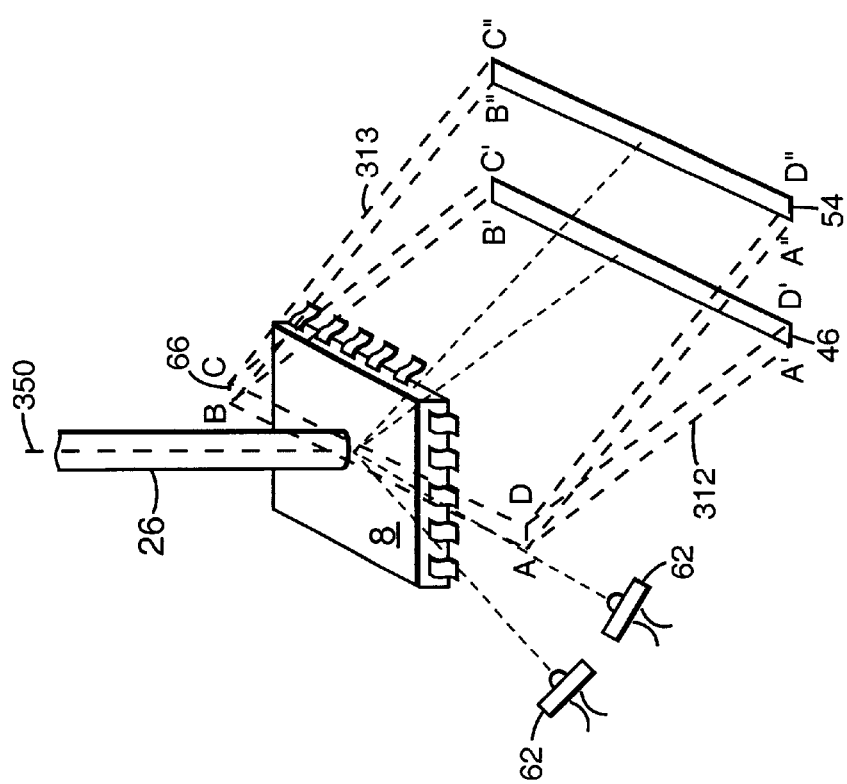

FIG. 15 shows a prism 330 above component 8. Prism 330 acts to receive light from source 74, and deliver two beams of light propagating in different directions to provide back lit or back lit shadow casting illumination. The prism is constructed so that light from substantially half the aperture of lens 64 is reflected off surface 391 of prism 330. Light from the remainder of the aperture of lens 64 is substantially transmitted through surface 391, substantially reflects off surface 392, and substantially transmitted through surface 391 again. The angle and size of the prism are chosen so that the beams propagating towards detectors 46,54 meet substantially in the stripe in the viewing plane. Prism 330 may also be made of a series of surfaces, such as mirrors and beamsplitters, which re-direct the light from source 62 towards detectors 46,54.

In FIGS. 16A–D, each of detectors 46 and 54 form a first and a second observation plane 312,313 as each detector views the same stripe 66. The central axis 350 of quill 26 slices through at least one of the observation planes 312,313 in a point. FIGS. 16A–D show off-axis embodiments with front-lit diffuse, back-lit, front-lit specular and back-lit shadow cast illumination, respectively. The width of detectors 46,54 is at least as wide as the width of component 8, so that the stripes which the detectors view are cross-component. Radially oriented stripes, such as those shown in FIGS. 7A–D, may also be used as appropriate.

Figure 17A:
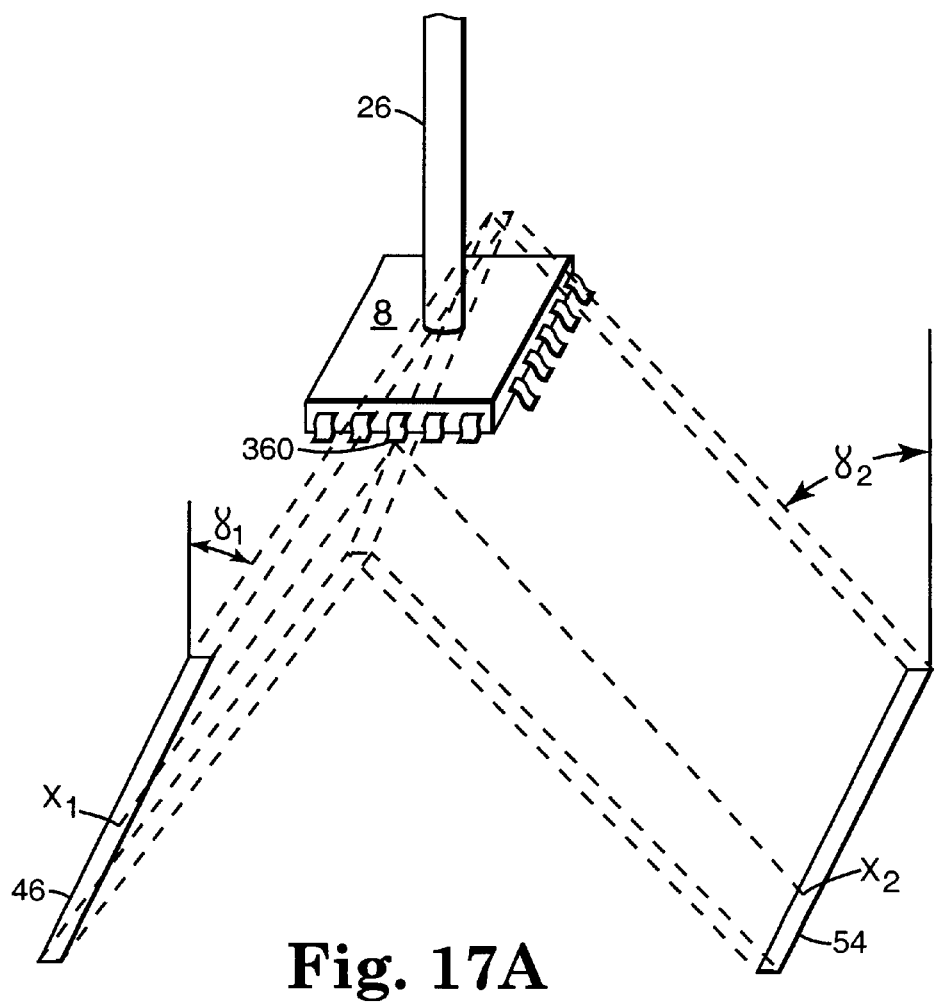
FIGS. 17A–B show an embodiment of the present invention where a cross component stripe is viewed offset from the center of the component, and corresponding superimposed views of the resulting Cartesian image array taken at two different angles, respectively.
Figure 17B:
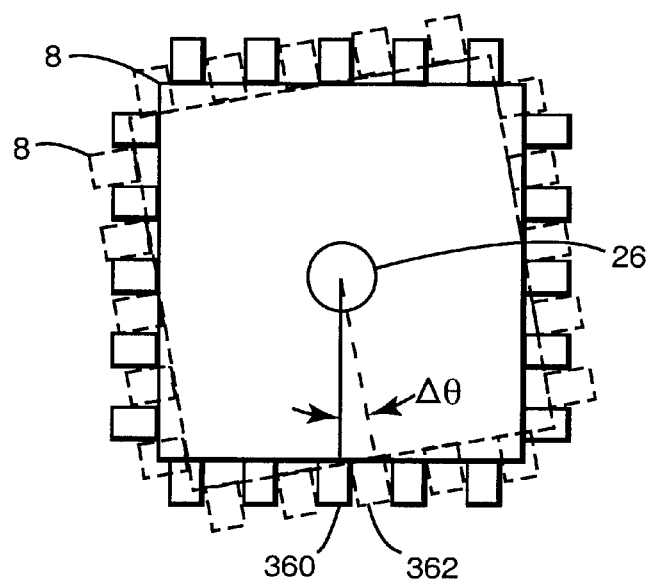

Features with height, as viewed by each detector in the present invention, appear shifted in angle between the two polar arrays. FIG. 17A shows a system of the present embodiment with detector 46 observing feature 360 at a first angular position of component 8 at position $x_1$ on detector 46. For purposes of discussion, reference designator 360 and 362 refers to the same feature on component 8. In this drawing, feature 360 is below the line where observation planes 312,313 intersect. Detector 46 is located so that it views stripe 66 off axis at an angle $\gamma_1$. At the first angular orientation of component 8, detector 54, which views stripe 66 off axis at an angle $\gamma_2$, does not view feature 360. As shown in FIG. 17B, a top view of component 8, detector 54 views feature 360 after the component has rotated by an angle $\Delta\theta$, and observes the feature at location 362 at location $x_2$ on detector 54. The origins for $x_1$ and $x_2$ are the points where detectors 46,54 respectively view the central axis. To begin, we break $\Delta\theta$ into two components $\theta_1$ and $\theta_2$ satisfying the following relationships:

$$\Delta\theta = \theta_2 - \theta_1 \quad (7)$$

$$\frac{\tan \gamma_1}{\tan \gamma_2} = \frac{\sin \theta_1}{\sin \theta_2} \quad (8)$$

$$\theta_1 = \sin^{-1}\left(\frac{\sin \Delta\theta}{\sqrt{\left(\frac{\tan \gamma_2}{\tan \gamma_1} - \cos \Delta\theta\right)^2 - \sin^2 \Delta\theta}}\right) \quad (9)$$

From these observations, the height, h, relative to the intersection of observation planes 312,313 can be calculated as:

$$h = x_1 \tan \theta_1 \cot \gamma_1 \quad (10)$$

Further, if the first observation of the feature was made at encoder position $E_1$, the polar coordinates of the feature are:

$$\theta = E_1 - \theta_1 \quad (11)$$

$$R = x_1 \sec \theta_1 \quad (12)$$

Figure 18:
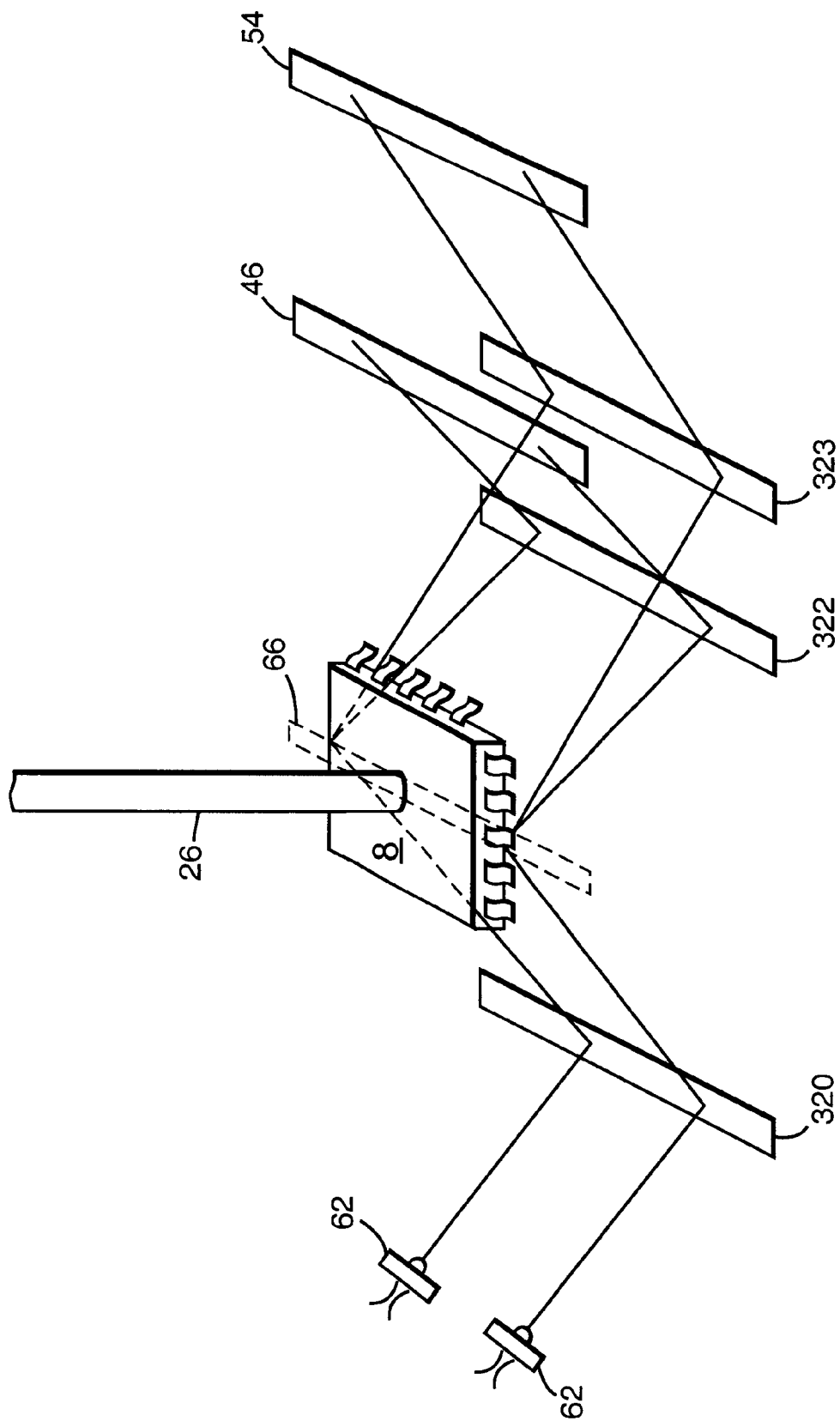
FIG. 18 shows the embodiment of FIGS. 17A–B, with mirrors interposed in the transmit and receive paths.

FIG. 18 shows the embodiment of FIGS. 16A–D where mirrors are interposed in the transmit and receive path. In particular, a mirror 320 is interposed between sources 62,62 and stripe 66 in the transmit optical path, and mirrors 322,323 are interposed between stripe 66 and the detectors 46,54, respectively in the receive path. It is understood that the sensor of the present embodiment may also be realized with any subset of mirrors.

Figure 19:
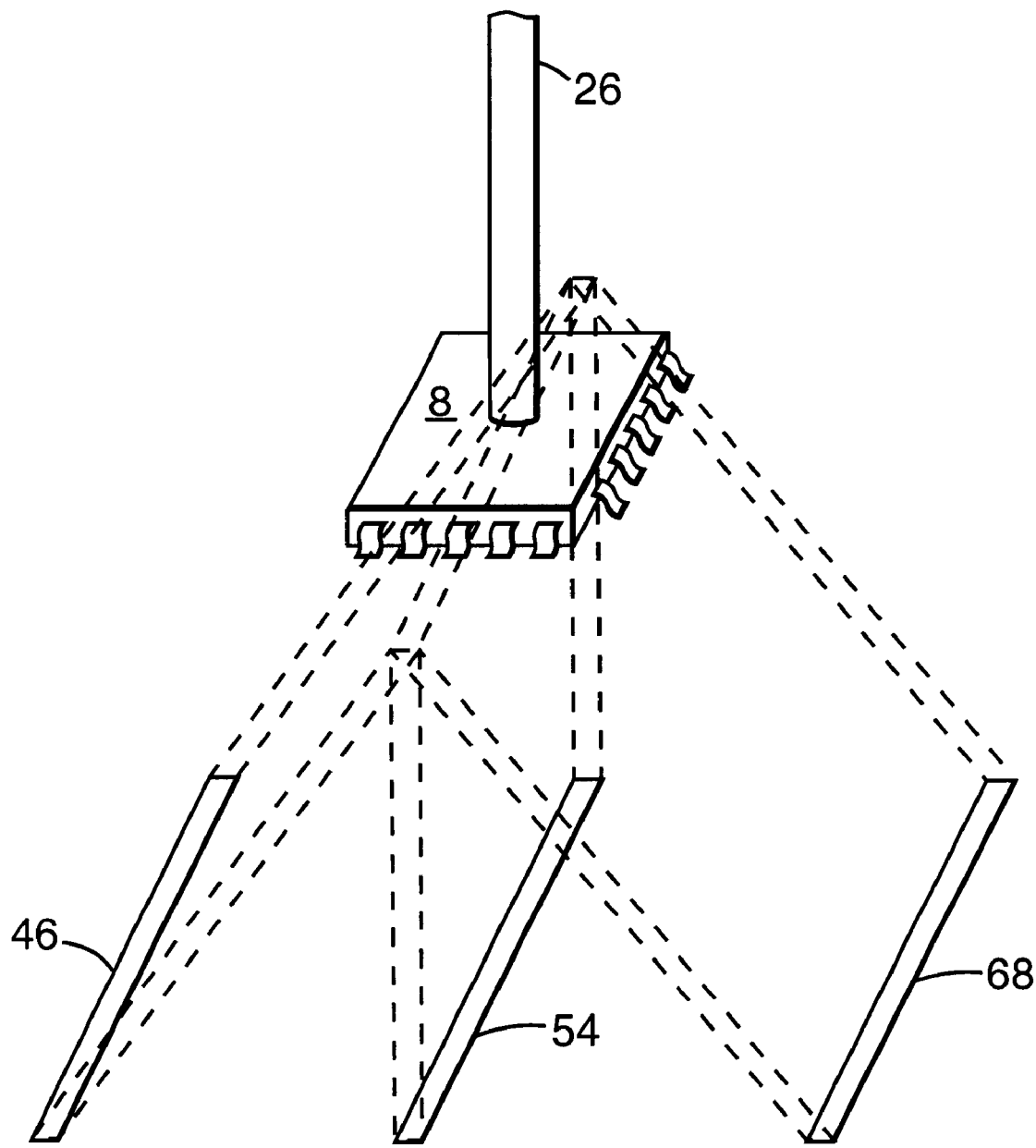
FIG. 19 shows a three detector embodiment of the present invention.

FIG. 19 shows a three detector embodiment of the present invention, which shows three detectors with their major axes substantially parallel to one another. Two of the detectors 54,68 are positioned off-axis, and all three detectors 46,54,68 are positioned to view stripe 66. Other orientations of three detector embodiments are possible, specifically ones where the principal axes of the detectors are substantially coincident and ones where none of the detectors view the stripe from a normal orientation. Additionally, although radial detectors 46,54,68 are shown in this figure, cross component detectors may alternatively be employed. Other configurations with three or more detectors may also be realized, in order to provide an improved ability to locate a desired feature.

Figure 20A:
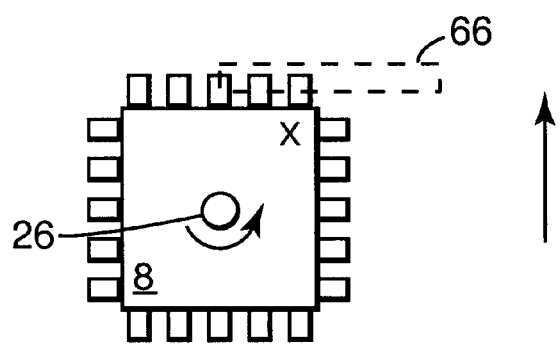
FIG. 20 shows a combination of quill translation and component rotation which allows inspection with less than 360 degree rotation.
Figure 20B:
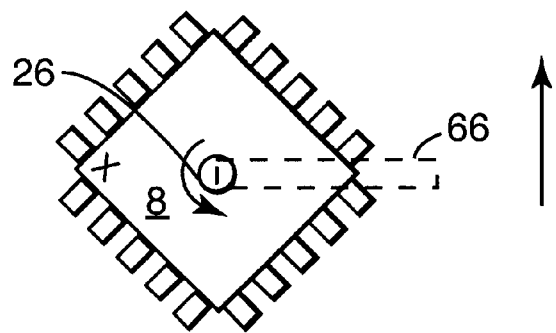
Figure 20C:
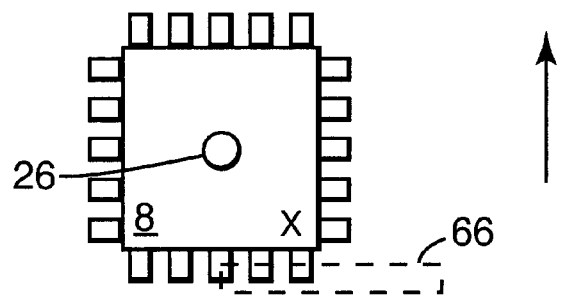

In all the previously disclosed methods, central axis 316 is stationary with respect to detectors 46,54. In the method shown in FIGS. 20A–C, central axis 316 moves in the x and/or y direction while component 8 rotates and detectors 46,54 acquire images. In each of FIGS. 20A–C, the position of central axis 316 relative to stripe 66 is variable. This method can be employed with any of the disclosed embodiments, and has the advantage that data about the entire component may be acquired with less rotation that the method where the central axis is stationary with respect to the detectors. It may also result in shorter time from pickup to placement because the head merely slows down in the vicinity of the sensor rather than coming to a complete stop.

While a number of alternative embodiments have been disclosed, combinations of one embodiment with another and variations on explicitly disclosed embodiments will be obvious to those skilled in the art. Within the teaching of the present invention, each of such modifications, combinations and variations are within the spirit and scope of the invention. For example, there are both two and three detector embodiments disclosed in this document, and the interested worker in the field will recognize that sensors with more than three detectors may also be made. Furthermore, variations or additional steps in the methods of practicing the present invention, such as steps of pre-rotating components or post-rotating components, or translating various parts of the claimed system out of the way while other parts are moved into place to be viewed by the detector, are understood to be obvious extensions of those already disclosed, or equivalent thereto. Component substitutions for various parts of the claimed system, especially optical substitutions which accomplish the same function of a disclosed part, shall also be considered to be obvious or equivalent to those already disclosed. Finally, additional components which are introduced into the disclosed embodiments and serve no purpose other than sharpening images, or additional mirrors which function to bend a light path in between two essential component in the present invention or the like, shall also be considered to be obvious and equivalent to those optical-mechanical embodiments of the present invention disclosed in this application.

What is claimed is:

1. A system for providing a signal related to a physical condition of an object, the system comprising:
    a quill for releasably holding the object, the quill having a central axis;
    a motion control system for rotating the quill about the central axis, a viewing plane substantially perpendicular to the central axis;
    control electronics for providing a plurality of trigger signals;
    two detectors each adapted to view a common stripe in the viewing plane upon receipt of a trigger signal and each to provide an image of the stripe, the detectors viewing a plurality of stripes while the motion control system rotates the quill; and
    processing circuitry for processing the plurality of images of the stripes to provide the signal related to the physical condition of the object.
2. The system of claim 1 where the two detectors are separate from each other.
3. The system of claim 1 where the two detectors are located in the same package.
4. The system of claim 1 where each detector resides within a common linear array.
5. The system of claim 1 where the two detectors each have a principal axis, and the principal axes are substantially parallel to each other.
6. The system of claim 1 where the two detectors each have a principal axis, and the principal axes are substantially coincident.
7. The system of claim 1 further comprising a third detector, the third detector adapted to view the same stripe in the viewing plane.
8. The system of claim 7 where the three detectors each have a principal axis, and the principal axes are substantially parallel to each other.
9. The system of claim 1 where one of the detectors is located substantially directly beneath the stripe.
10. The system of claim 9 where the other detectors view the stripe from an oblique angle.
11. The system of claim 1 where the detectors view the stripe from an oblique angle.
12. The system of claim 11 where the detectors are substantially perpendicular to each other.
13. The system of claim 12 where a transmit optical path is formed between the light source and the stripe in the viewing plane, and where a mirror is interposed in the transmit optical path.
14. The system of claim 1 further comprising a light source for illuminating at least a portion of the stripe.
15. The system of claim 14 where the light source is adapted to provide front-lit illumination of the stripe.
16. The system of claim 15 where the front-lit illumination is specular.
17. The system of claim 15 where the front-lit illumination is diffuse.
18. The system of claim 15 where the front-lit illumination is diffuse and specular.
19. The system of claim 14 where the light source is adapted to provide back-lit illumination of the stripe.
20. The system of claim 14 where the light source is adapted to provide back-lit shadow illumination of the stripe.
21. The system of claim 14 where the light source is a laser.
22. The system of claim 14 where the light source is an LED.
23. The system of claim 22 further comprising at least one additional LED.
24. The system of claim 14 where a partially reflecting mirror and at least one reflective surface are positioned above the object, so that some light from the light source is reflected off the partially reflecting mirror and falls on one of the detectors, and the other light from the light source travels through the partially reflecting mirror and is re-directed off of the reflective surface so that the other light falls on the other detector.
25. The system of claim 24 where the reflective surface and the partially reflective mirror form surfaces of a prism.
26. The system of claim 24 where the reflective surface is a mirror.
27. The system of claim 1 where a receive optical path is formed between the detector and the stripe in the viewing plane, and where a mirror is interposed in the receive optical path.
28. The system of claim 1 further comprising:
    a head mechanically coupled to the quill;
    a motor drive unit for translatably moving the head, where the head and the quill move to transport the object.
29. The system of claim 28 where the head moves in the x direction.
30. The system of claim 28 where the head moves in the y direction.
31. The system of claim 28 where the detectors are mechanically coupled to the head so that the detectors move with the head.

32. The system of claim 28 where the detectors are at a fixed location and the head moves the object to the fixed location.

33. The system of claim 1 where each of the detectors is a linear array.

34. The system of claim 33 where the linear arrays are CCD sensors.

35. The system of claim 33 where the linear arrays have substantially 1024 pixels.

36. The system of claim 33 where the linear arrays have substantially 2048 pixels.

37. The system of claim 33 where the linear arrays have a plurality of pixels, with certain of the pixels functioning as a first detector and other of the pixels functioning as a second detector.

38. The system of claim 1 where the object is an electronic component.

39. The system of claim 38 where the major surface of the component and the viewing plane are coincident.

40. The system of claim 38 where the major surface of the component and the viewing plane are substantially parallel.

41. The system of claim 38 where the major surface of the component is a top thereof.

42. The system of claim 38 where the major surface of the component is a bottom thereof.

43. The system of claim 42 where the bottom of the component has raised features thereon, the features selected from the group of features called balls, columns, pins and leads, where the viewing plane is formed from a plurality of the features.

44. The system of claim 43 where the features include leads and the processing circuitry receives a plurality of gray values representative of areas on the viewing plane and identifies at least two areas which correspond to a first lead tip area and a second lead tip area, the processing circuitry computing an orientation of the component from the two lead tip areas, the signal representative of the orientation of the component.

45. The system of claim 44 where the first lead tip area is located substantially opposite to the second lead tip area.

46. The system of claim 43 where the features include leads and the processing circuitry receives a plurality of gray values representative of areas on the viewing plane and identifies at least two areas which correspond to areas on two successive lead tips, the processing circuitry computing a distance between the areas on the lead tips, the signal representative of the distance between the areas on the lead tips.

47. The system of claim 46 further comprising a host processor coupled to the processing circuitry, the host processor communicating design information related to the component, where the design information is representative of an acceptable spacing between leads and further, where the processing circuitry compares the distance to the acceptable spacing and provides the signal, the signal representative of lead tweeze.

48. The system of claim 43, where the features include leads and the processing circuitry receives a plurality of gray values representative of areas on the viewing plane and identifies at least four areas which correspond to areas on lead tips, the processing circuitry computing the coplanarity of the lead tips, the signal representative of the coplanarity.

49. The system of claim 43 where the processing circuitry receives a plurality of gray values representative of areas on the plane and identifies at least two areas, one area corresponding to a first feature and the other area corresponding to a second feature, the processing circuitry computing an orientation of the component from the two areas, the signal representative of the orientation of the component.

50. The system of claim 49 where the first feature is adjacent to a first side of side of the component and the second feature adjacent to a second side of the component, the first side opposite from the second side.

51. The system of claim 43 further comprising a host processor coupled to the processing circuitry, the host processor communicating design information related to the component, where the design information is representative of the expected locations of the features and further, where the processing circuitry receives a plurality of gray values representative of areas on the viewing plane proximate to the expected location of a feature and determines whether the feature is present on the component, the signal representative of the presence of the feature.

52. The system of claim 43 where the processing circuitry receives a plurality of gray values representative of areas on the plane and identifies at least four gray values which correspond to areas on the features, the processing circuitry computing the coplanarity of the features, the signal representative of the coplanarity of the features.

53. The system of claim 1 where the object has a center and a pair of edges, one edge substantially opposite the other, where one stripe image represents an area including the edges and the center.

54. The system of claim 53, where the motion control system rotates the object substantially through 180 degrees to provide the signal related to the physical condition of the object.

55. The system of claim 53 where the processing circuitry receives two sets of data points, one set from each detector, each set corresponding to a data point corresponding to a single feature on the object, the processing circuitry operating on the sets to provide a height of the feature relative to the viewing plane.

56. The system of claim 1 where the object has a center and a perimeter, and where the detector is positioned so that the plurality of stripes substantially represent areas emanating substantially radially from the center and which include the perimeter of the object.

57. The system of claim 56 where the motion control system rotates the object substantially through 360 degrees to provide the signal related to the physical condition of the object.

58. The system of claim 56 where the processing circuitry receives two sets of data points, one from each detector, each set including a data point representative of a single feature on the object, the processing circuitry operating on the sets to provide a height of the feature relative to a reference plane.

59. The system of claim 1 further comprising a lens system for forming an optical image of the stripe on the detector.

60. The system of claim 59 where the lens system includes an array of GRIN rod lenses.

61. The system of claim 1 where two observation planes are formed between each of the detectors and the stripe in the viewing plane and at least one of the observation planes intersects the central axis in a point.

62. The system of claim 1 where two observation planes are formed between each of the detectors and the stripe in the viewing plane and the central axis is in the observation planes.

63. The system of claim 1, wherein the common stripe is the entire area viewed by said detectors.

64. A method for providing a signal related to a physical condition of an object, comprising the steps of:

1. Releasably picking up the object with a quill, the quill having a central axis with a viewing plane substantially perpendicular thereto;
2. Positioning the object relative to at least two detectors, the detectors adapted to view a stripe in the viewing plane and including electronics adapted to provide a signal representative of a physical condition of the component; and
3. Rotating the component while acquiring a plurality of images of the stripes, the electronics providing the signal as a function of the images.

65. The method of claim 64 where the central axis and the detectors are fixed with respect to each other while the component rotates.

66. The method of claim 64 where the central axis of rotation and the detectors are translatably moved with respect to each other while the component rotates.

67. A method of claim 64 further comprising the step of deciding whether to discard the object as a function of the signal.

68. A method of claim 64 where the signal is representative of the orientation of the object on the quill.

69. A method of claim 64 where the object is an electronic component, the electronic component having features selected from the set of features called balls, columns, pins and leads, where the signal is representative of the coplanarity of the features.

70. A method of claim 64 where the object is an electronic component, the electronic component having features selected from the set of features called balls, columns, pins and leads, and where the signal is representative of the presence of at least one feature.

71. A method of claim 64 further comprising the steps of moving the object to a placement area and placing the object as a function of the signal.

72. The method of claim 64 further comprising the steps of moving the object to a placement area after step 1 has started and placing the object as a function of the signal.

73. The method of claim 64 further comprising the steps of moving the object to a placement area after step 2 has started and placing the object as a function of the signal.

74. The method of claim 64 further comprising the steps of moving the object to a placement area after step 3 has started and placing the object as a function of the signal.

75. The method of claim 64 where a head is mechanically coupled to the quill and the detectors travel with the head.

76. The method of claim 64, wherein the stripe is a common stripe in the viewing plane.

77. The method of claim 76, wherein the common stripe is the entire area viewed by said detectors.

\* \* \* \* \*